(12) United States Patent
Burr et al.

(10) Patent No.: US 8,446,308 B2
(45) Date of Patent: May 21, 2013

(54) APPARATUS FOR DETECTION OF A LEADING EDGE OF A PHOTO SENSOR OUTPUT SIGNAL

(75) Inventors: Kent Burr, Buffalo Grove, IL (US); Gin-Chung Wang, Grayslake, IL (US); John S. Jedrzejewski, Niles, IL (US); Gregory J. Mann, Wheaton, IL (US)

(73) Assignees: Kabushiki Kaisha Toshiba, Tokyo (JP); Toshiba Medical Systems Corporation, Otawara-shi (JP)

( * ) Notice: Subject to any disclaimer, the term of this patent is extended or adjusted under 35 U.S.C. 154(b) by 131 days.

(21) Appl. No.: 13/091,985

(22) Filed: Apr. 21, 2011

(65) Prior Publication Data

US 2012/0268303 A1    Oct. 25, 2012

(51) Int. Cl.
*H03M 1/12* (2006.01)

(52) U.S. Cl.
USPC .......... 341/156; 327/51; 327/69; 327/70; 375/354; 375/376; 363/41

(58) Field of Classification Search
USPC ....... 341/141–163; 375/354–376; 327/51–70; 363/41
See application file for complete search history.

(56) References Cited

U.S. PATENT DOCUMENTS

| | | | |
|---|---|---|---|
| 5,684,850 A | 11/1997 | Warburton et al. | |
| 5,774,522 A | 6/1998 | Warburton | |
| 5,870,051 A | 2/1999 | Warburton et al. | |
| 5,873,054 A | 2/1999 | Warburton et al. | |
| 5,889,487 A * | 3/1999 | Burns et al. | 341/159 |
| 6,486,809 B1 * | 11/2002 | Figoli | 341/141 |
| 7,154,422 B2 * | 12/2006 | Wen | 341/120 |
| 7,411,533 B2 * | 8/2008 | Posamentier | 341/122 |
| 7,417,472 B2 * | 8/2008 | Tümer et al. | 327/70 |
| 7,532,136 B2 * | 5/2009 | McMahon et al. | 341/141 |
| 7,719,453 B2 * | 5/2010 | Kim et al. | 341/133 |
| 8,169,354 B2 * | 5/2012 | Douzane et al. | 341/155 |
| 8,174,419 B2 * | 5/2012 | Adamo et al. | 341/141 |
| 8,199,043 B2 * | 6/2012 | Van Der Plas et al. | 341/161 |
| 2011/0001053 A1 | 1/2011 | Solf | |

FOREIGN PATENT DOCUMENTS

| | | |
|---|---|---|
| JP | 2007-041007 A | 2/2007 |
| JP | 2007-163516 A | 6/2007 |
| WO | 2009/112962 A2 | 9/2009 |
| WO | 2011/039819 A1 | 4/2011 |
| WO | 2012/144635 A1 | 10/2012 |

OTHER PUBLICATIONS

U.S. Appl. No. 13/343,541, filed Jan. 4, 2012, Burr, et al.
U.S. Appl. No. 13/091,928, Apr. 21, 2011, Mann, et al.
U.S. Appl. No. 13/153,611, Jun. 6, 2011, Gagnon, et al.

* cited by examiner

*Primary Examiner* — Lam T Mai
(74) *Attorney, Agent, or Firm* — Oblon, Spivak, McClelland, Maier & Neustadt, L.L.P.

(57) ABSTRACT

A system and method for processing an analog signal output by a sensor. The system and method converting, using at least one analog-to-digital converter (ADC), the analog output signal to a digital signal, the digital signal including a plurality of samples at a predetermined resolution, detecting whether a trigger condition is met by analyzing the digital signal, detecting an event based on trigger information from the detecting whether a trigger condition is met, generating event information having time information included therein when the event is detected, defining one or more time windows based on the time information included in the event information, performing decimation on the digital signal based on the defined one or more time windows to generate a decimated signal, and outputting the decimated signal.

34 Claims, 18 Drawing Sheets

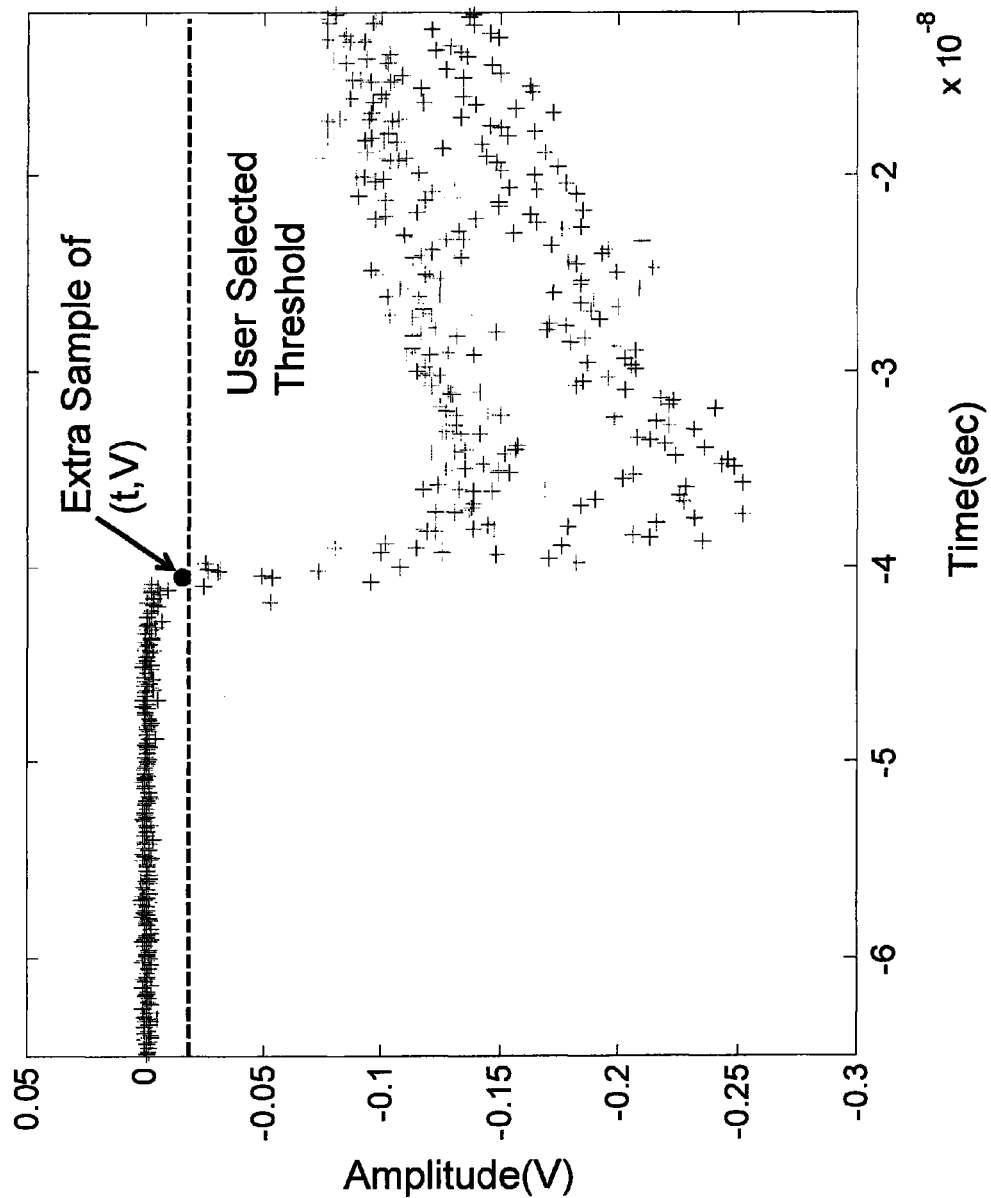

APPARATUS FOR DETECTION OF A LEADING EDGE OF A PHOTO SENSOR OUTPUT SIGNAL

CROSS-REFERENCE TO RELATED APPLICATIONS

This application is related to applications TMRU-0146 ("Photomultiplier Tube with Integrated Fast Analog-to-Digital Conversion for Event De-randomizer and Digital Time Stamping") and TMRU-098 ("Timing Pick-Off of Undersampled Pulses"), the contents of which are incorporated herein by reference.

FIELD

The embodiments described herein relate generally to an apparatus, computer readable medium, and method for receiving and processing photosensor output signals to identify and more accurately process detected events.

BACKGROUND

In positron emission tomography (PET) imaging, a radiopharmaceutical agent is administered, via injection, inhalation and/or ingestion, to a patient. The physical and bio-molecular properties of the agent then concentrate at specific locations in the human body. The actual spatial distribution, intensity of the point and/or region of accumulation, as well as the kinetics of the process from administration and capture to eventual elimination, all have clinical significance. During this process, the positron emitter attached to the radiopharmaceutical agent emits positrons according to the physical properties of the isotope, such as half-life, branching ratio, etc. Each positron interacts with an electron of the object, is annihilated and produces two gamma rays at 511 keV, which travel at substantially 180 degrees apart. The two gamma rays then cause a scintillation event at a scintillation crystal of the PET detector, which detects the gamma rays thereby. By detecting these two gamma rays, and drawing a line between their locations or "line-of-response," the likely location of the original annihilation is determined. While this process only identifies one line of possible interaction, accumulating a large number of these lines, and through a tomographic reconstruction process, the original distribution is estimated with useful accuracy. In addition to the location of the two scintillation events, if accurate timing—within few hundred picoseconds—is available, time-of-flight calculations are also made in order to add more information regarding the likely position of the annihilation event along the line. A specific characteristic of the isotope (for example, energy of the positron) contributes (via positron range and co-linearity of the two gamma rays) to the determination of the spatial resolution for a specific radiopharmaceutical agent.

The above process is repeated for a large number of annihilation events. While every case needs to be analyzed to determine how many scintillation events are required to support the desired imaging tasks, conventionally a typical 100 cm long, FDG (fluoro-deoxyglucose) study accumulates about 100 millions counts or events.

As shown in FIG. 1, detection of the leading edge of an output pulse from a photosensor 2000 is traditionally performed via a threshold discriminator circuit 2001 connected to a time-to-digital converter 2002. In addition, the analog output signal from the PMT can be sampled with a filter 2003 and a relatively slow (<200 MHz or Msample/sec) analog-to-digital converter (ADC) 2004, and the peak or integral of the event can be extracted from the sampled data. The peak or integral is used to calculate the energy and position of the event, usually by combining measurements from multiple photosensors.

However, using a threshold discriminator circuit requires a set of analog circuits to manipulate the PMT signal prior to input to the discriminator. Each analog circuit contributes to loss of fidelity of the signal. Additionally, due to the need for multiple threshold circuits, information contained in the shape of the leading edge of the signal may be lost and the accuracy of the leading edge measurement is reduced.

Using a high bandwidth ADC can provide much finer granularity of the magnitude of the output signal. However, in order to obtain the large amount of information included in the leading edge of the signal, a large number of samples must be obtained by the ADC. Obtaining a large number of samples leads to a large amount of data being produced by the ADC, which is difficult to store and manage.

BRIEF DESCRIPTION OF THE DRAWINGS

A more complete appreciation of the disclosed embodiments and many of the attendant advantages thereof will be readily obtained as the same becomes better understood by reference to the following detailed description when considered in connection with the accompanying drawings, wherein:

FIG. 16 illustrates a graph showing samples from several ADC-sampled pulses in addition to an extra sample using the comparator/TDC combination shown in FIG. 2B.

DETAILED DESCRIPTION

Figure 1:
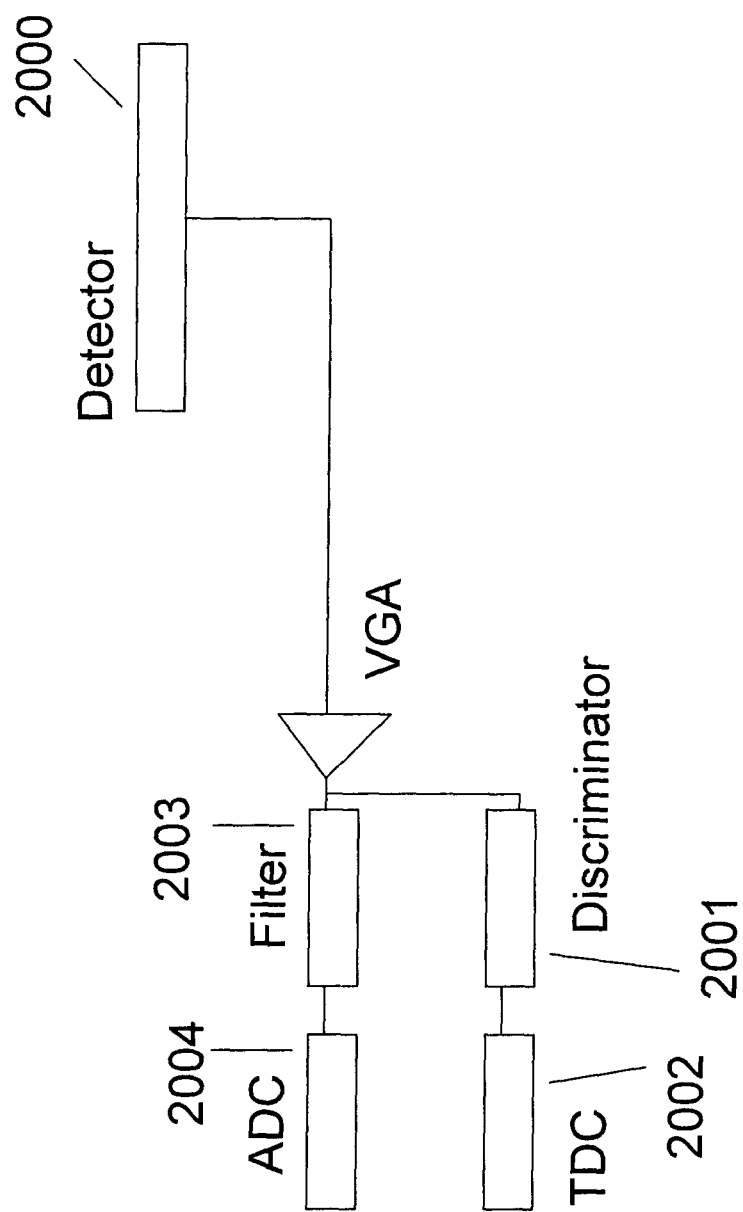
FIG. 1 is a schematic drawing showing an analog processing circuit of a conventional PET system.

In one embodiment, a system for processing an analog signal output by a sensor is described. The system includes at least one analog-to-digital converter (ADC) that converts the analog output signal to a digital signal, the digital signal including a plurality of samples at a predetermined resolution, a trigger detection unit that detects whether a trigger condition is met by analyzing the digital signal, and an event detection unit that detects an event based on trigger information from the trigger detection unit and generates event information having time information included therein when the event is detected. Also included in the system is a decimation unit that defines one or more time windows based on the time information included in the event information and that performs decimation on the digital signal based on the defined one or more time windows to generate a decimated signal and an output unit that outputs the decimated signal.

In another embodiment, the at least one ADC includes a pair of ADCs, with each ADC operating at a fraction of a frequency corresponding to the predetermined resolution and each ADC operates in an interleave mode such that a first ADC samples the analog signal and a second ADC samples parts of the analog signal between samples obtained by the first ADC.

In another embodiment, a combined sampling rate of the pair of ADCs is 1 GHz or more.

In another embodiment, each ADC has a sampling rate of 500 MHz or more.

In another embodiment, the at least one ADC includes a pair of ADCs and the system further includes a switch which switches the system between an interleaved mode in which each ADC operates at a fraction of a frequency corresponding to the predetermined resolution, and a non-interleaved mode in which the pair of ADCs process independent channels.

In another embodiment, the trigger detection unit detects that the trigger condition is met when a predetermined number of data points in the digital signal are detected as being above a predetermined threshold.

In another embodiment, the trigger detection unit detects whether the trigger condition is met based on a programmable trigger condition.

In another embodiment, the system includes a digital filtering unit that performs digital filtering on the digital signal prior to the trigger detection unit performing trigger detection on the digital signal.

In another embodiment, the digital filtering unit is programmable.

In another embodiment, the output of only a single ADC is passed to the trigger detection unit.

In another embodiment, the event detection unit is further configured to output the event information to a device external to the system in response to the detection of an event.

In another embodiment, the event detection unit is further configured to, in response to the detection of an event, output the event information to an external device, the external device having an ADC configured to convert an analog signal related to the analog signal.

In another embodiment, the trigger detection unit detects whether a trigger condition is met based on a derivative of the digital signal or a low-pass filtering of the digital signal.

In another embodiment, the decimation unit performs decimation on the digital signal using low-pass filtering and downsampling, and by using different decimation factors for different time segments of the digital data.

In another embodiment, the output unit outputs a value equal to an integral of the digital signal over a programmable time window.

In another embodiment, the output unit outputs a pile-up indicator indicating that time windows of two events overlap.

In another embodiment, a comparator and a time-to-digital converter is included in the system. The comparator and the time to time-to-digital converter provide an extra sampling point obtained at a leading edge of the event in the analog output signal.

In another embodiment, the decimation unit receives the extra sampling point obtained at the leading edge of the event in the analog output signal and transmits information related to the extra sampling point to the output unit, the extra sampling point being output along with the decimated signal.

Further, according to another embodiment, there is described a method for processing an analog signal output by a sensor. The method includes steps of converting, using at least one analog-to-digital converter (ADC), the analog output signal to a digital signal, the digital signal including a plurality of samples at a predetermined resolution and detecting whether a trigger condition is met by analyzing the digital signal. Also included in the method are steps of detecting an event based on trigger information from the step of detecting whether a trigger condition is met, generating event information having time information included therein when the event is detected, defining one or more time windows based on the time information included in the event information, performing decimation on the digital signal based on the defined one or more time windows to generate a decimated signal, and outputting the decimated signal.

Referring now to the drawings wherein like reference numbers designate identical or corresponding parts throughout the several views and more particularly to FIG. 2 thereof, there is illustrated a photo-multiplier tube output signal processing system 100.

Figure 2A:
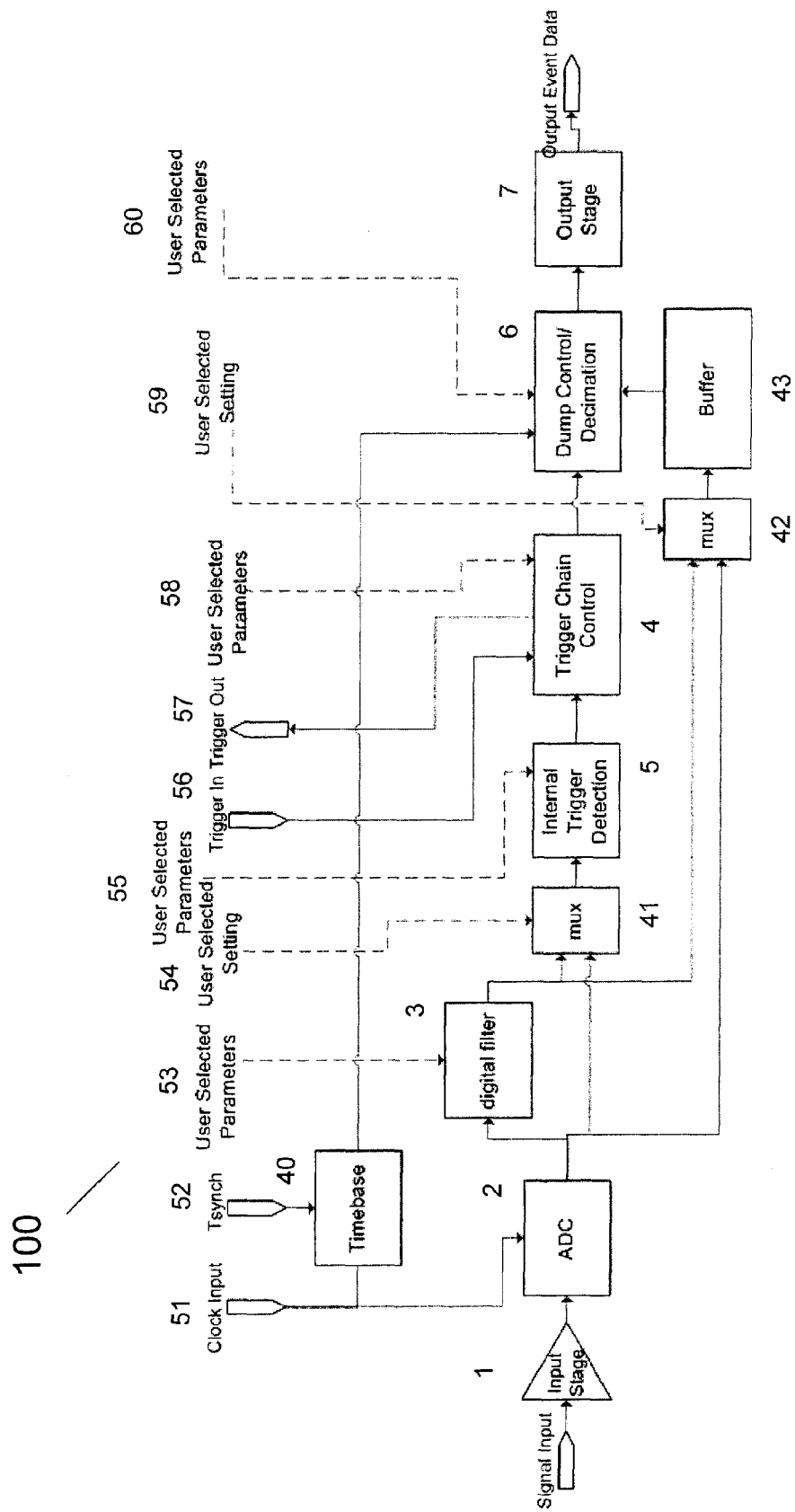
FIG. 2A is a schematic drawing showing an embodiment of a photosensor output signal processing system.

In one embodiment, as is shown in FIG. 2A, the photosensor output signal processing system 100 includes, at least, an input stage 1, an ADC 2, a digital filter 3, an internal trigger detector 5, a trigger chain control unit 4, a dump control/decimation unit 6, and an output stage 7. The photosensor output signal processing system 100 identifies and captures important information regarding an event in the photosensor output signal. The photosensor output signal is output by a photosensor such as a photomultiplier tube (PMT), a silicon photomultiplier (SiPM), an avalanche photodiode (APD), etc.

Figure 3:
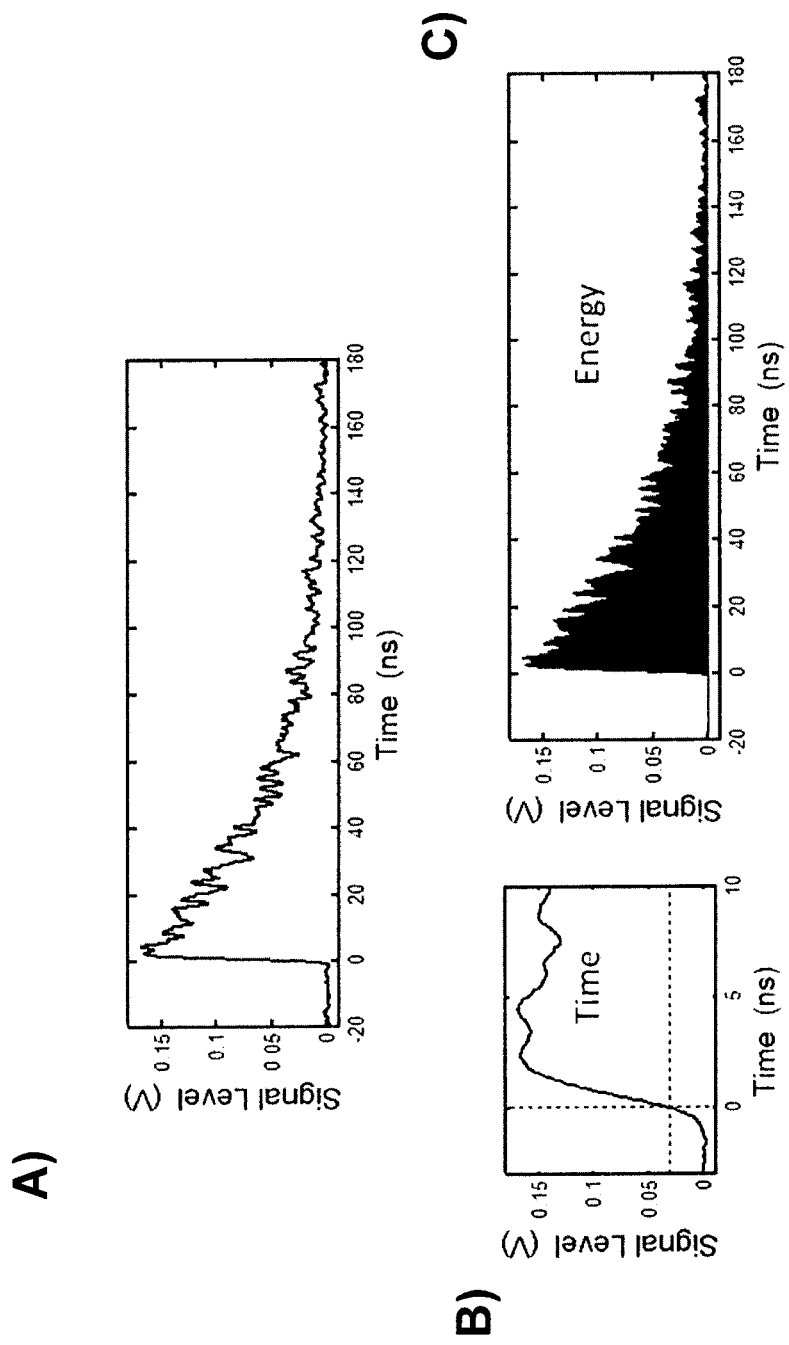
FIGS. 3A-C illustrate exemplary signals output by a photomultiplier tube.

A photosensor such as a PMT detects scintillation light and outputs an analog signal as shown in FIG. 3A. An event is reflected in the analog photosensor output signal, which is input to the ADC to produce a digital signal. When analyzing the signal, the leading edge of the event is important, at least because the information in the leading edge can be used to extract event timing information, as shown in FIG. 3B. However, the entire signal is also important because the integral of the entire signal can be used to establish the energy of the event, as shown in FIG. 3C. The integral of the signal is also used, usually in combination with signals from other photosensors, to calculate the event position when traditional optical multiplexing approaches, such as so-called block detectors, are employed.

The use of photosensors in this context is challenging because of two main factors: (1) extraction of the main characteristics (energy and timing) of the event, and handling of a highly variable rate of arrival for those events. Obtaining the energy and timing of an event is non-trivial as it is usually performed in a noisy background. Analog-based triggering and filtering of this type of signal requires specialized analog electronics and a costly development effort. This task is further complicated by the fact each photosensor has intrinsic characteristics (gain, average transit time, etc.) that require that the circuitry be adaptable to varied conditions.

In addition, difficulties exist related to the count rate. It is clear that most radiation detection processes follow a stochastic process, which is very accurately described by Poisson's law. This law leads to the conclusion that on average the time between events is the reciprocal of the number of counts collected in one second. However, in actuality, the time varies according to an exponential distribution. Therefore, in practice, if a system is designed to accept one count every millisecond but, in fact, generates at least 1000 counts per second, the system will only capture around 74% of the counts.

Therefore, in order to address these difficulties, the photosensor output signal is sampled by a high speed ADC.

The embodiment shown in FIG. 2A illustrates an overview of the photosensor output signal processing system 100. In this embodiment, the ADC section 2 receives the analog photosensor output signal from the input stage 1. The ADC section receives a clock input 51. The clock input 51 is also distributed to the timebase unit 40. The timebase unit 40 receives a tsynch signal 52, which allows synchronization of all similar units that are connected to the photosensor output signal processing system 100.

The ADC section 2 is also connected to digital filter section 3, multiplexer 41, and multiplexer 42. The digital filter section 3 is configurable and has an input 53 for receiving user selected parameters. The Multiplexer 41 is connected to the internal trigger detection section 5 and allows the user to select whether direct ADC output or digitally filtered output is used for internal trigger detection by the internal trigger detection section.

The multiplexer 42 is connected to the buffer 43 of the dump control/decimation section 6 and allows the user to select whether direct ADC output or digitally filtered output is buffered and used to generate output event data by the dump control/decimation section 6. The internal trigger detection section 5 is connected to the Mux 41 and only considers data from the photosensor output signal processing system 100. Trigger information is passed to trigger chain control section 4, which is the final arbiter for making a determination regarding triggering. The user selected parameters 55 are received by the internal trigger detection section 5 and used in generating an internal trigger signal.

The trigger chain control section 4 is connected between the internal trigger detection section 5 and the dump control/decimation section 6. The trigger chain control section 4 also includes trigger-in connection 56 and trigger-out connection 57. User selected parameters 58 are also received by the trigger chain control unit 4. In addition, the trigger chain control 4 accepts multiple inputs, such as the internal trigger signal and external trigger-in signal, and makes a determination regarding whether, and at what point, in time, an event has occurred.

When an event is determined to have occurred by the trigger chain control unit 4, this information is passed to the dump control/decimation section 6 as a trigger out signal. In addition, in response to the event being determined to have occurred by the trigger chain control unit 4, the dump control/decimation section 6 is activated (if the dump control section is inactive).

The dump control/decimation section 6 is connected between the trigger chain control section 4 and the output stage 7 and receives user selected parameters 60. Data which is obtained by the ADC is received at the buffer 43 via the Mux 42. This data is accessed by the dump control/decimation section 6, which is connected to the timebase 40. The appropriate data is then output to the output stage 7.

Figure 2B:
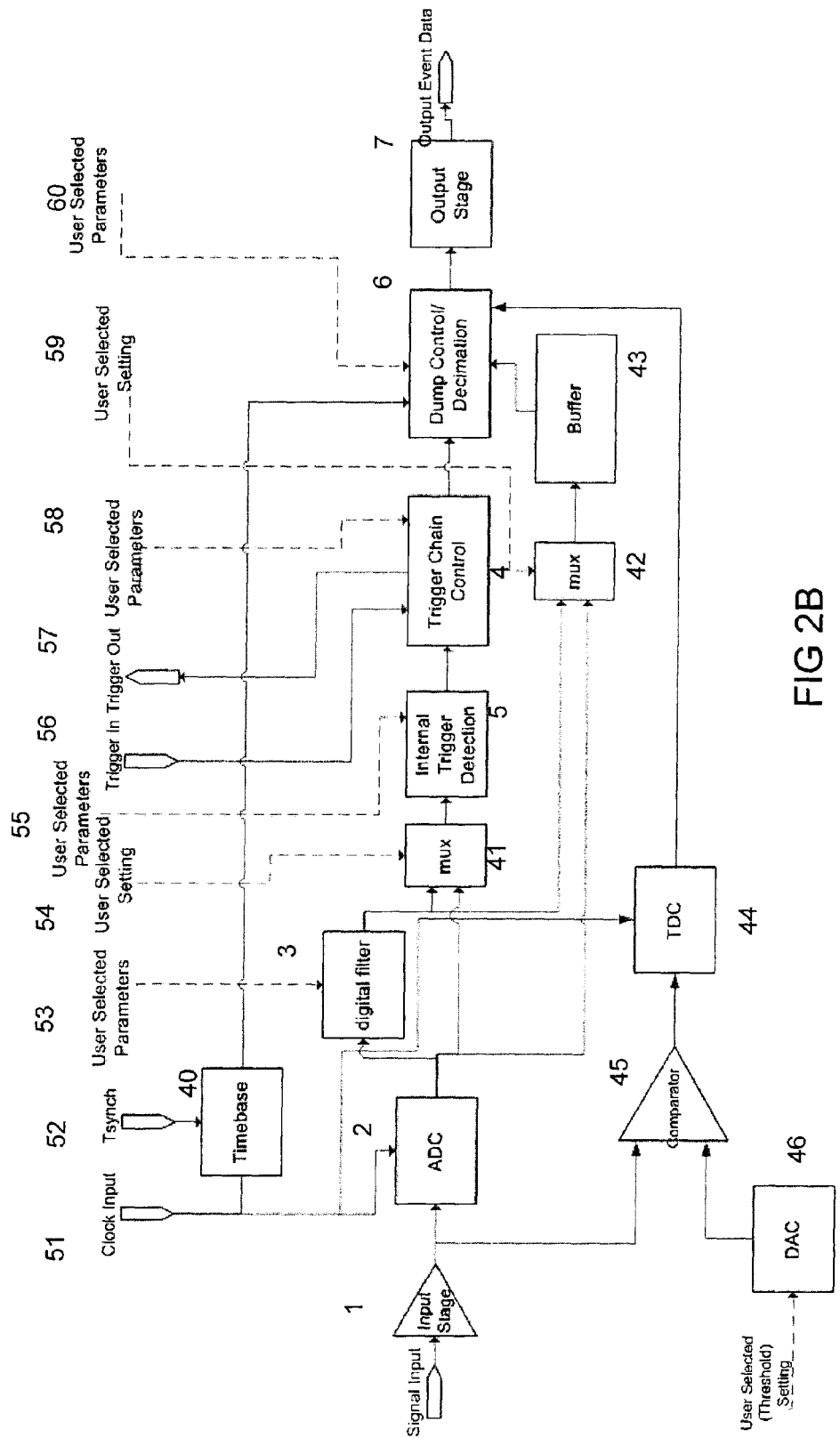
FIG. 2B is a schematic drawing showing an embodiment of a photosensor output signal processing system.

The photosensor output signal processing system 100a shown in FIG. 2B represents another embodiment. The embodiment shown in FIG. 2B is similar to FIG. 2A except for the inclusion of a comparator 45/time-to-digital converter ("TDC") 44 combination that supplies additional sampling points. This additional circuitry provides the possibility of using a slower speed ADC while still retaining important timing information derived from the leading edge of the pulse. Timing information is retained by the comparator 45/TDC 44 combination because the combination guarantees that a sample is obtained on the leading edge of the pulse, which, in general, is not guaranteed when a slower ADC is used. The sample provided by the comparator 45/TDC 44 combination is asynchronous to the ADC 2 sampling. It should be noted that the TDC 44 provides a time-stamp (relative to the system clock) when the comparator is triggered. The digital-to-analog converter ("DAC") 46 enables a user to set the comparator 45 threshold. The required TDC 44 resolution depends on the targeted system timing resolution. A 50 ps or better resolution is an example of a resolution used in time-of-flight capable systems. FIG. 16 illustrates an example of a comparator 45 threshold which is set for the system. In particular, FIG. 16 shows that an extra sample of (t, V) is obtained on the leading edge of the event of the sampled analog signal. This extra sample can be used by the dump control/decimation section 6 in the determination of the time window, and it can be used in subsequent processing steps to better estimate the arrival time of the event. For example, the extra sample can be used in subsequent processing steps, which would be performed on an output signal, to improve the estimate of the arrival time of the event pulse, particularly when a slower ADC sampling rate is used. Thus, the extra sample can be sent to the output stage 7 for output.

Figure 2C:
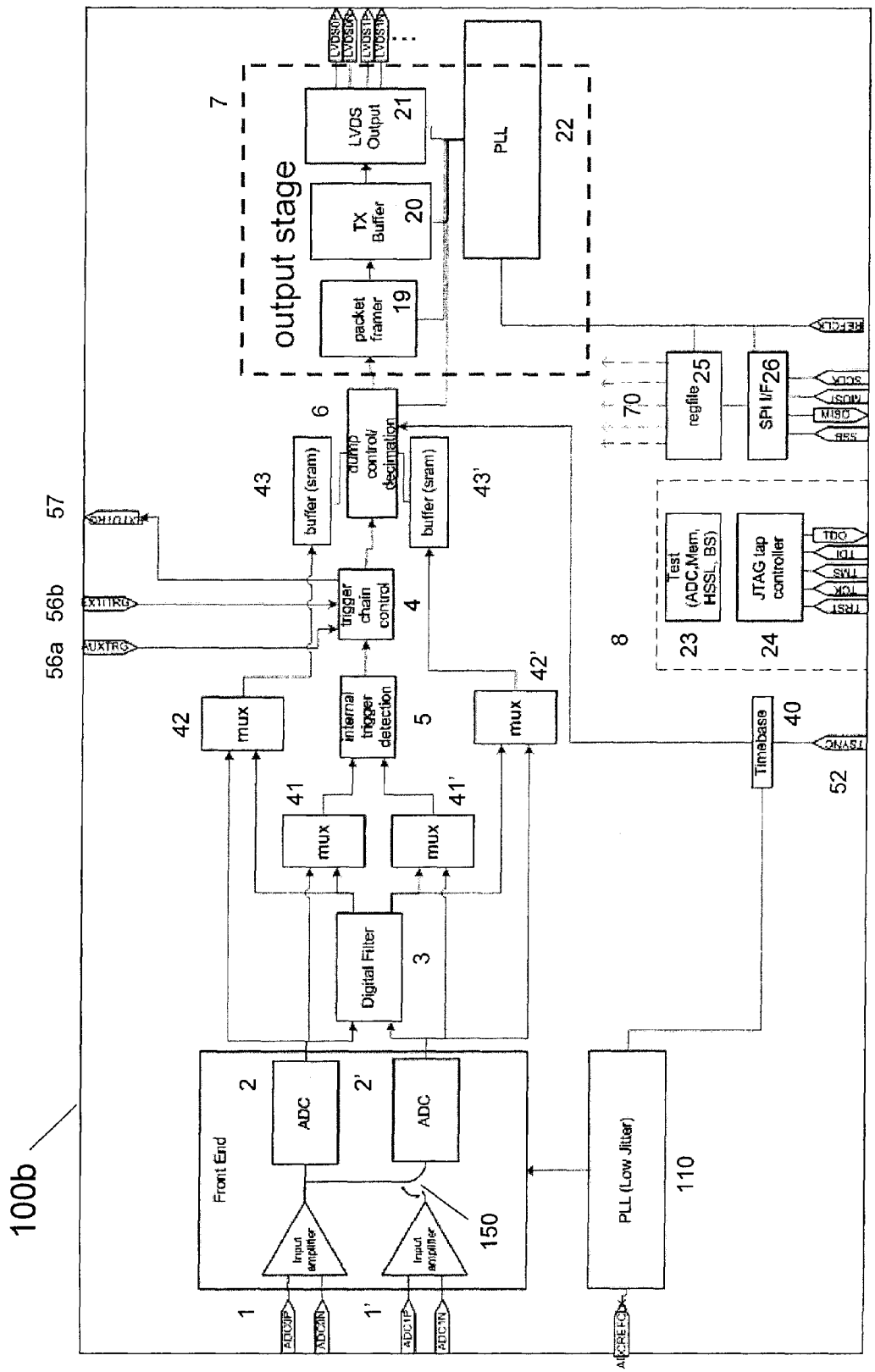
FIG. 2C is a schematic drawing showing an embodiment of a photosensor output signal processing system.

The photosensor output signal processing system 100b of the embodiment shown in FIG. 2C is an exemplary implementation of the photosensor output signal processing system 100 shown in FIG. 2A.

In the embodiment shown in FIG. 2C, the ADC section includes at least one ADC 2 and possibly additional ADCs 2'. As an event includes a large amount of information at the leading edge, a fast ADC is necessary. For instance, at least a 1 GHz ADC is necessary, a 2 GHz ADC is preferred, and a 4 GHz ADC will better accommodate fast scintillator crystals. Moreover, an 8-bit ADC is necessary, a 10-bit is preferred, and a 12-bit is more preferred.

Figure 4:
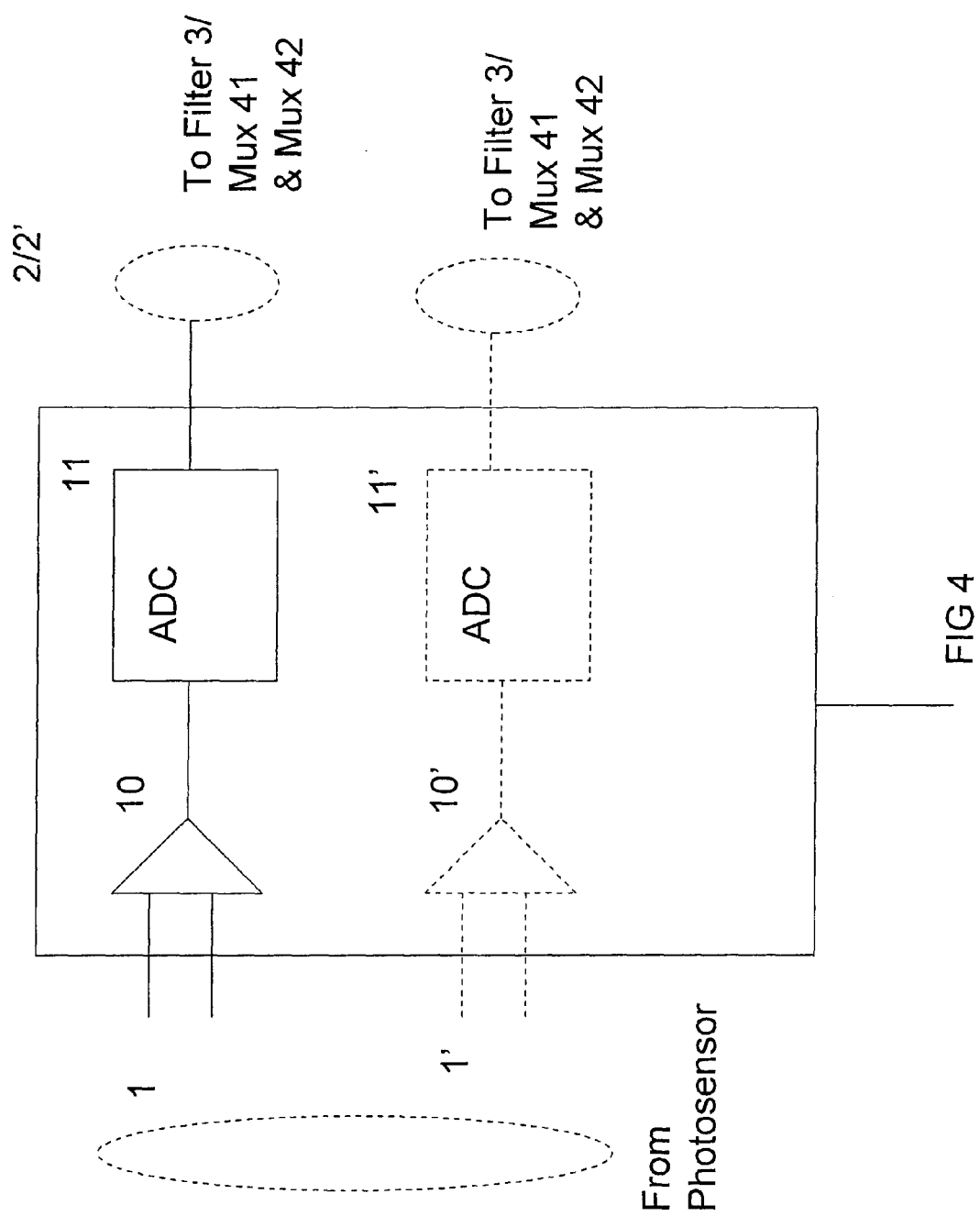
FIG. 4 illustrates an ADC section of a photosensor output signal processing system according to one embodiment.

As is shown in further detail in FIG. 4, the photosensor output signal is input to the photosensor output signal processing system 100 via input 1 and possibly via input 1'. If input 1' is utilized, input 1' receives a copy of the photosensor output signal input into input 1. Alternatively, input 1' can receive an output signal from a second photosensor. The system 100 is not limited to one or two inputs or to one or two ADCs, but can utilize a plurality of inputs 1' or ADCs 11'. The photosensor input signal is first input to an associated preamp chain having appropriate parameters (e.g., gain, etc.).

In addition, as is shown in FIG. 2C, a switch 150 allows the system to be switchable for interleaved (one input to both ADCs) or non-interleaved (two inputs to independent ADCs) operation.

This embodiment can be implemented using an ASIC having 2 ADCs and having two inputs. The ASIC could be configured to be used in interleave mode, such that only a single analog input would be used and routed to both ADCs, which would sample with a 180-degree phase difference. Alternatively, when configured for two independent inputs, two sensors could be input to the chip, and the two ADCs would not be interleaved, and the two signals would be processed independently. For example, a high performance system would use one chip for each sensor, while a lower performance system would use one chip for two sensors, thereby reducing the cost of the system.

When utilizing multiple ADCs 11, 11', etc., in interleaved mode, it is possible to utilize at least a pair of lower sampling rate ADCs with sufficient analog bandwidth and still obtain a faster total sampling rate. For example, if a 1 GHz sampling rate is required, two 500 MHz ADCs can be used, where the second ADC is offset from the first such that a greater number of samples can be obtained (e.g., using an interleaving mode).

In the ADC section 2 shown in FIG. 4, the photosensor output signal is input into input 1/1' where it is amplified by input amplifier 10/10' and input into ADC 11/11' where it is sampled. The ADC 11/11' is also connected to low-jitter clock with PLL 110, as shown in FIG. 2C. The PLL 110 is also connected to the timebase 40, which connects to the dump control/decimation unit 6 and which receives input from the tsync input 52, which allows synchronization of all similar units in a system having a plurality of devices.

Figure 5:
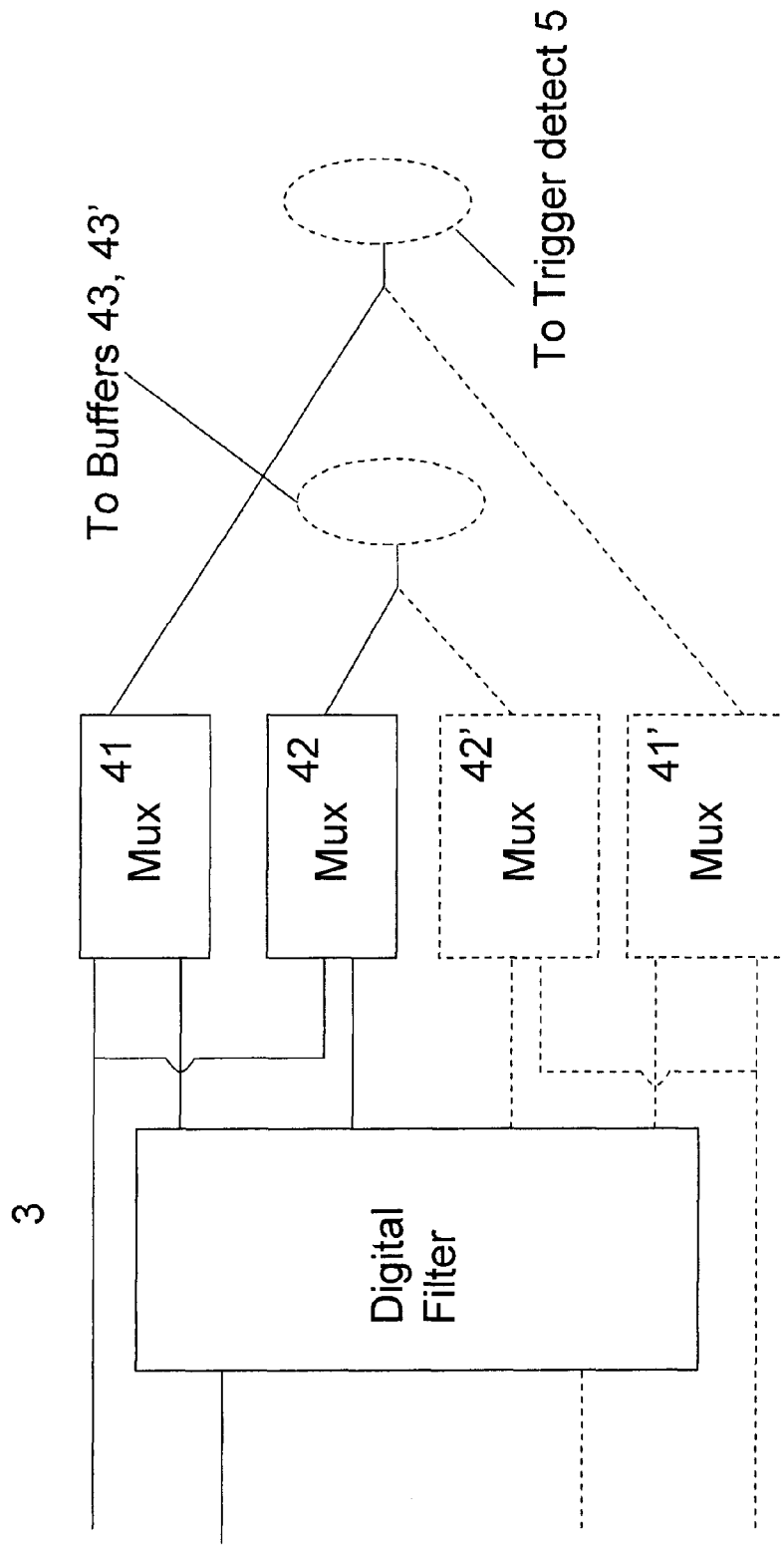
FIG. 5 illustrates a digital filter section of a photosensor output signal processing system according to one embodiment.

Once the ADC has sampled the photosensor output signal, the digital signal is optionally output to a digital filter 3. As is shown in FIG. 5, other types of complex filtering can be performed on the digital signal. The addition of a filtering step provides stabilization to downstream tasks. In addition, the filtering can be executed with the detailed knowledge of the shape of the pulse, which in turn is a combination of the intrinsic properties of the scintillation crystal and the frequency response of the photosensor. This additional filtering functionality is more difficult to apply directly at the photosensor level, independent of the rest of the architecture and/or the type of scintillator used, and is truly a system function. In addition, the filtering section can also include partially programmable filters.

The output from the programmable digital filter can be used in at least three different configurations:

(1) the output from the filter can be used to generate the output of the chip (i.e., filtered data is output to the dump control/decimation section 6 via Mux 42/42', with a copy of the data (un-filtered) also input to the internal trigger detection section 5 via Mux 41/41');

(2) the output from the filter can be used only for input to the internal trigger detection section 5 (i.e., un-filtered data is output to the to the dump control/decimation 6 via Mux 42/42', while a copy of the data (filtered) is used for the internal trigger detection section 5 via Mux 41/41'); and (3) the output of the filter can be used for both output to the dump control/decimation section 6 via Mux 42/42' and the internal trigger detection section 5 via Mux 41/41'.

The availability of the digital filter 3 improves the capability of the internal trigger detection section 5 to recognize multiple piled-up events as distinct events. In contrast, a simple leading-edge trigger will not recognize the second event if the tail of the first event has not first fallen far enough so that the signal is lower than the threshold.

The output from the digital filter section 3 is then sent to the internal trigger detection section 5 and to the dump control section 6 via Mux 41/41' and 42/42', respectively.

Figure 6:
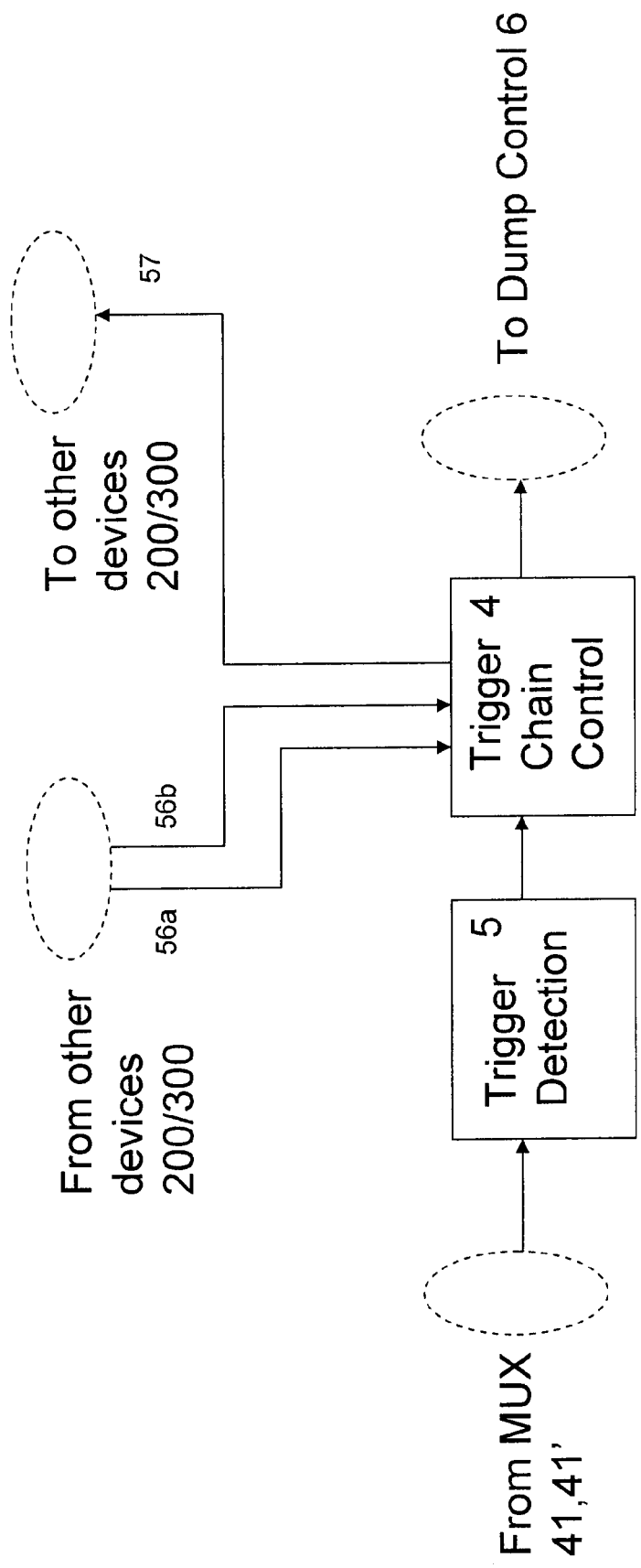
FIG. 6 illustrates a trigger detection section of a photosensor output signal processing system according to one embodiment.

As shown in FIG. 6, the output from the digital filter section 3, or alternatively the ADC section 2 via Mux 41/41', is input into the trigger detection unit 5 of the internal trigger detection section 5. In the internal trigger detection unit 5, the conditions for a trigger, such as the number of consecutive points above a threshold or a positive or negative slope value are analyzed. In addition, the internal trigger detection unit 5 can utilize a digitally filtered data so that overlapping (pile-up) events can be distinguished, for example. The result of the analysis by the internal trigger detection unit 5 is the identification of an internal trigger or an upcoming internal trigger in the photosensor output signal. The trigger chain control unit 4 is the final arbiter for determining whether an event has occurred.

Alternatively, instead of combining the output from the digital filters (if used), each ADC 2/2' can have its own built-in trigger analysis. In the case of two photosensor output signals feeding two ADCs 2/2', the presence of a trigger on one line will be passed to the other channel so that ADC data output from both channels can be triggered.

The trigger chain control unit 4 shown in FIG. 6 is able to receive trigger information from various sources and, taking into account all the received information, make a determination as to whether an event has occurred. The trigger chain control unit 4 receives input from the internal trigger detection unit 5, an auxiliary trigger input 56a, and an external trigger input 56b. The trigger chain control unit 4 is programmable to give different weights to different trigger inputs by way of user-selected parameters.

Once a trigger is detected based on information from the internal trigger detection 5 and/or from other devices 200/300 via 56a/56b, this trigger information can be passed outside the photosensor output signal processing system 100 so that other sections of circuitry involved in the detection process can initiate their own data identification and communication steps. For example, the photosensor output signal processing system 100 can be connected to one or a plurality of additional photosensor output signal processing devices 200/300. The trigger chain control unit 4 receives information from the trigger detection unit 5 and/or other devices and makes a determination as to whether an event has occurred. This information is then passed to the other sections of circuitry, such as the additional photosensor output signal processing devices 200/300. The trigger information passed to other devices may include time information (a master clock cycle number from the "timebase", for example) and photosensor ID information. The additional photosensor output signal processing devices 200/300 can then use this information, which indicates that an event has been detected, to perform localized dump control or other processes on data that has been obtained locally at the additional photosensor output signal processing devices 200/300.

In addition, as is noted above, the trigger chain control unit 4 can receive information from the additional photosensor output signal processing devices 200/300. This received information can include information about triggers detected at the additional photosensor output signal processing devices 200/300 or other information.

The trigger chain control unit 4 can be connected directly to the additional photosensor output signal processing devices 200/300 or to a system bus to which the additional photosensor output signal processing devices 200/300 are also connected. The trigger chain control unit 4 can be programmable to receive only information from certain additional photosensor output signal processing devices 200/300, in effect selectively obtaining information from the bus. In addition, the trigger detection unit 4 can be configured to identify an event taking into account information from certain (but not all) additional photosensor output signal processing devices 200/300 and/or the internal trigger detection. Alternatively, the additional photosensor output signal processing devices 200/

300 can be connected to the same photosensor as the photosensor output signal processing system 100.

The trigger chain control unit 4 can be configured to identify certain information based on an ID that is attached to the information received at the trigger chain control unit 4. The ID identifies that the information corresponds to a particular photosensor. This information is then compared against a table or some other pre-stored information, which allows the trigger chain control unit 4 to weigh this information in determining whether an event has occurred. In addition, the trigger chain control unit 4 can use the ID attached to the information to selectively filter which information is obtained from the bus.

Thus, the trigger chain control unit 4 can determine whether an event has occurred and whether the dump control should be alerted, based on the information received from the internal trigger detection section 5, based on information received from one of the additional photosensor output signal processing devices 200/300, and/or based on information regarding the location or importance of a photosensor that has produced a signal that resulted in a trigger detection.

In addition, the trigger chain control unit 4 can be a programmable controller, which allows the photosensor output signal processing system 100 to respond to triggers from different neighboring photosensors. Moreover, the programmable controller can be re-programmed on the fly. This programming is achieved through the board function section 8. This feature is useful in examinations (such as Rb-82 for cardiac imaging) in which the count rates vary by orders of magnitude during the scan. At high count rates, information regarding smaller regions of photosensors could be obtained for a single event (to avoid noise from the tails of previous events in photosensors that are not very close to the origin of the event, and to limit the total amount of data that needs to be processed), and at low count rates, information regarding a larger region of photosensors could be obtained for each event. The programmability of the controller would allow for the photosensor output signal processing system 100 to be triggered by any combination of triggering events (in other photosensors) that could be described using standard logic (AND, OR, etc, and in combinations thereof).

The trigger detection unit 5 is able to obtain both information regarding the beginning of the triggering occurrence and information regarding the end of the triggering occurrence. This information helps the trigger chain control 4 and later the dump control/decimation section 6 in determining what data to discard and what data to pass to the output stage 7.

Figure 7:
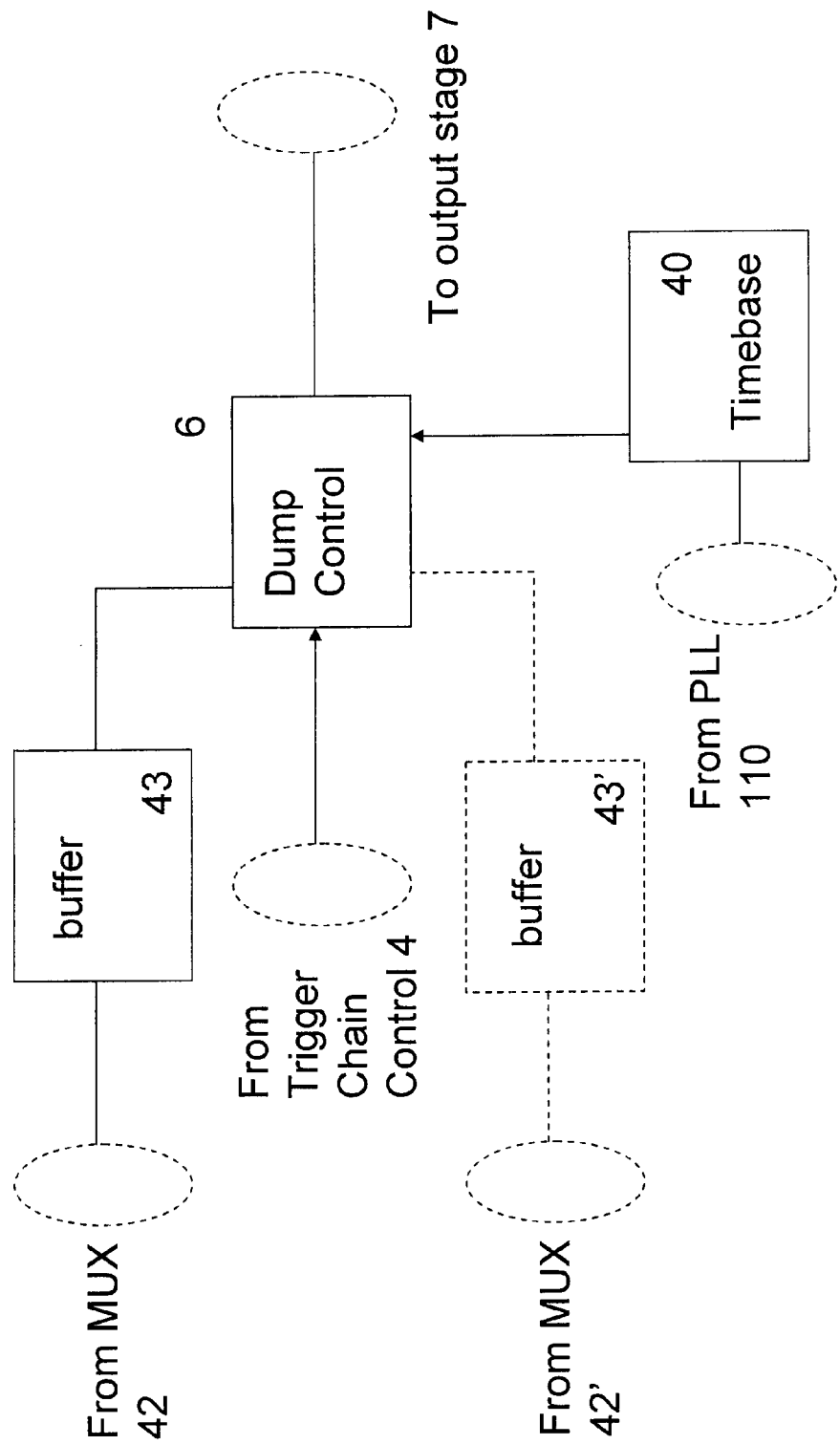
FIG. 7 illustrates a dump control section of the photosensor output signal processing system according to one embodiment.

As shown in FIG. 7, the dump control section 6 identifies pertinent portions of the signal pulse that, in general, will be required or that include pertinent information, and dumps, decimates, or discards the non-pertinent portions. The pertinent portions of the pulse include points obtained prior to the discovery of the pulse and a preset amount of data (or time) after the pulse has been detected. In addition, the amount of data or time which is obtained after or before the pulse has been detected can be dynamically determined depending on the intended use for the data. Data packets identified as being pertinent are sent to the output stage 7 from the dump control section 6 for the combined channel or for each individual channel sequentially.

Note that the subset of the data determined as pertinent may (and usually will) include ADC points prior to the discovery of the trigger. As shown in FIG. 7, the buffer 43/43' enables this data to be obtained and passed on to the output stage 7.

As shown in FIG. 7, data from the ADC section 2/2' sent either directly or via the filtering section 3 is received by the dump control section 6 via the buffer 43/43' and Mux 42/42'.

If multiple ADCs 2' are used, then a corresponding number of buffers 43' and Muxes 42' may also be used. Alternatively, a different number of buffers 43' and Muxes 42' may be used than the number of ADCs 2'.

The dump control/decimation unit 6 receives information from the trigger chain control unit 4 that indicates which parts of the signal should be passed on to the output stage 7 and which parts of the signal should be discarded, decimated, or dumped.

The dump control/decimation unit 6 is able to use a number of different techniques for determining which data should be discarded based on the receipt of the trigger information from the trigger chain control unit 4. For instance, limiting the amount of data output can be achieved by defining one or more time windows, with one of more decimation factors (which could be unity indicating no data reduction). Such a determination is important because, at very high sampling rates, if all the data is going to be output, the transceivers must handle very high data rates. If only limited amounts of data need to be transferred (by use of the windows and decimation), then slower, lower-power transceivers can be used.

The dump control/decimation unit 6 is also connected to the timebase 40. The timebase 40 is a counter which counts master clock cycles. A photosensor system such as a PET system using this embodiment would include several of these units. The timebase 40 on each device can be zeroed by the Tsynch input 52, thereby allowing all of the timebase 40 units in each of the devices to be synchronized.

Accurate timing information for the arrival of a gamma ray can be derived by examining the leading-edge of the pulse, which can be captured with high bandwidth and sampling rate (multiple GHz or higher), enabling the preservation of the full timing information. In addition to timing, the photosensor system can also identify the location of the gamma interaction and the energy of the event. The calculation of position and energy requires information about the entire pulse (e.g., the integral of the pulse), but with significantly lower bandwidth and sample rate requirements. Passing the entire pulse i.e., all samples, at the full sample rate is one option, but this requires very high data transfer rates.

Figure 8:
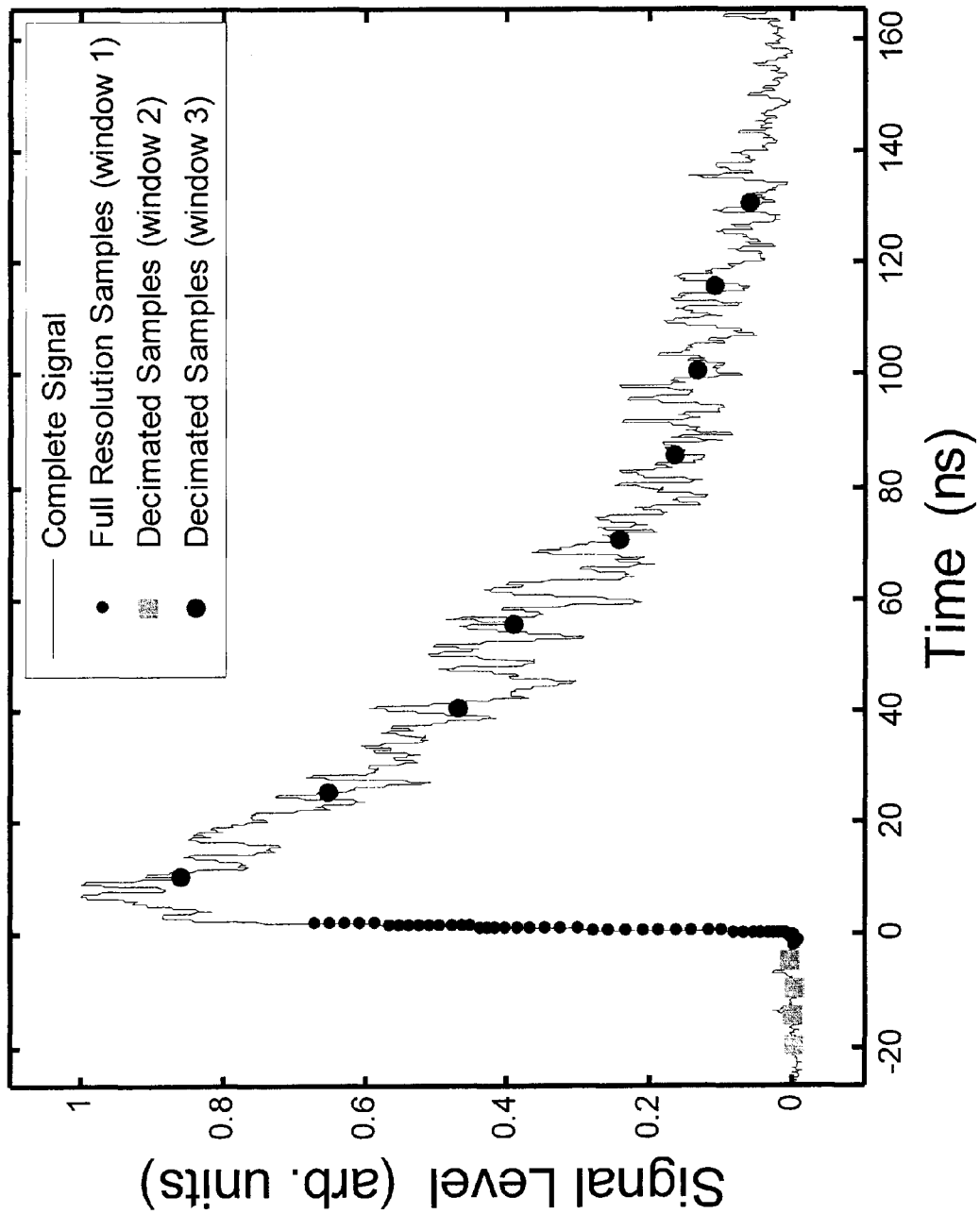
FIG. 8 illustrates a graph showing multiple windows applied to a signal obtained from a photosensor in a first time base.
Figure 9:
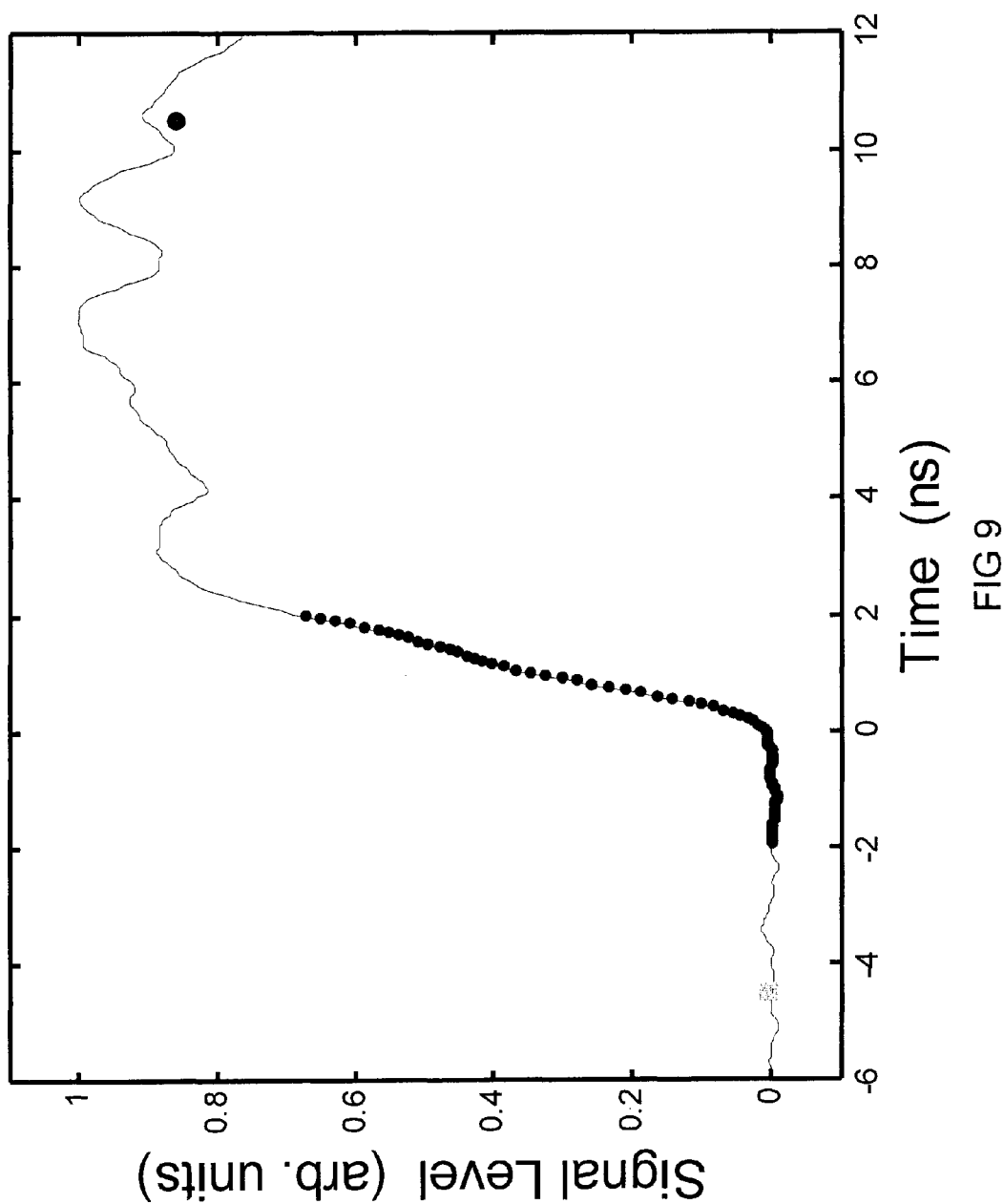
FIG. 9 illustrates a graph showing multiple windows applied to a signal obtained from a photosensor in a second time base.
Figure 10:
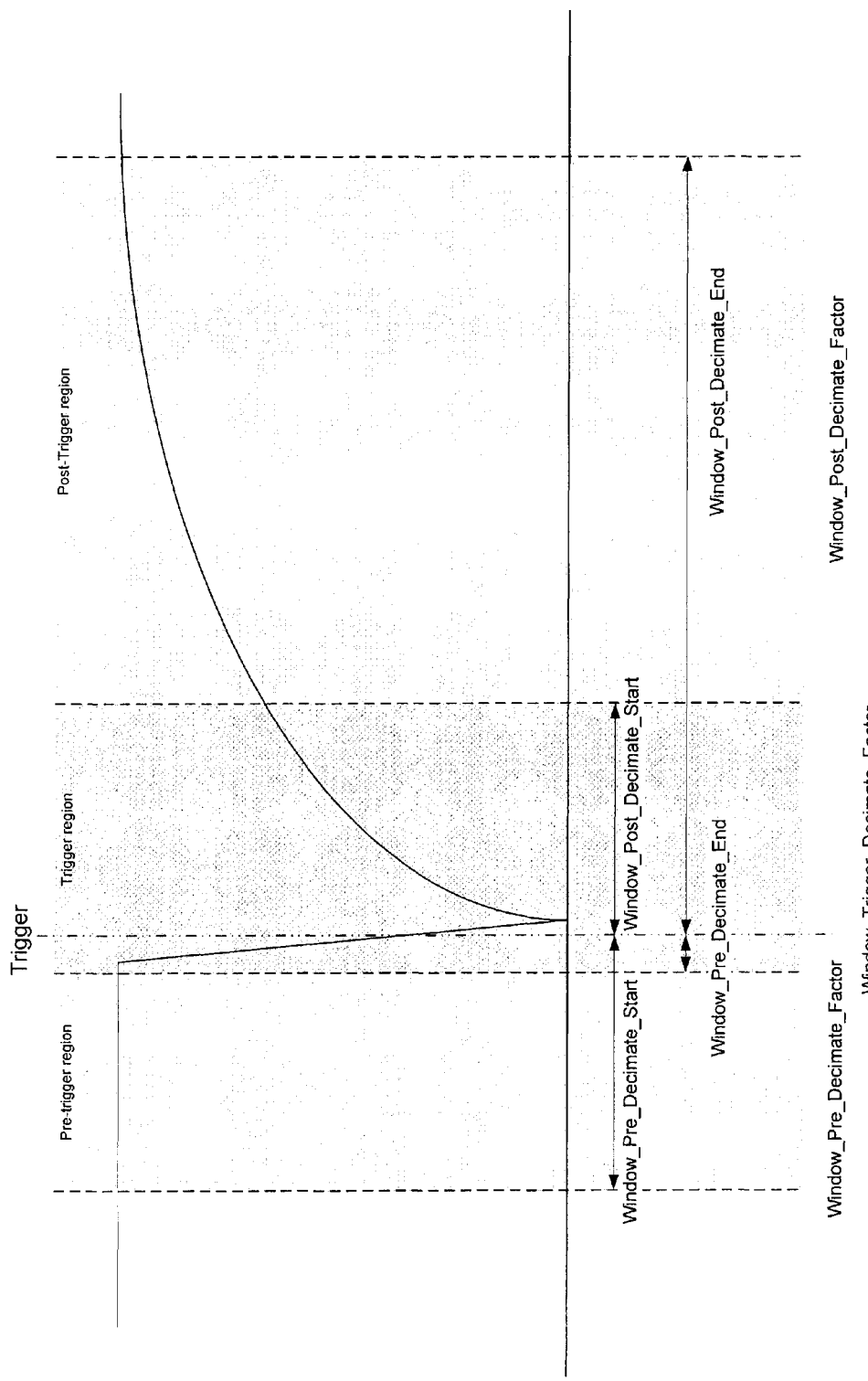
FIG. 10 illustrates a graph showing multiple windows applied to a negative signal obtained from a photosensor.

However, it is possible to reduce the required data transfer rates, while preserving the information that is relevant for the determination of timing, position, and energy. One way to achieve this is by using multiple time windows, with different decimation factors e.g., low-pass filter followed by downsampling. For example, as shown in FIG. 8, for the points near the leading edge of the pulse, a first window can be defined as a full resolution window in which the full sample rate is output, allowing heightened accuracy in the timing information. A second window can be defined as including samples obtained after the leading edge, in which the signal output is decimated at a much lower rate, e.g., 100 MHz. The decimated samples from the second window following the leading edge can be used for energy and position calculation. A third window can be defined as including samples obtained prior to the leading edge, with a different decimation factor. The samples from this third window can be used, for example, in a pile-up correction algorithm. The inclusion of samples prior to the trigger is made possible by the presence of the sample buffer 43/43', which could be a circular buffer. FIG. 10 shows a negative pulse highlighting the various windows. FIGS. 8 and 9 show positive pulses. FIG. 9 is similar to FIG. 8, but with a different time base. The concepts of windows and decimation do not depend on the polarity of the signal.

Figure 11:
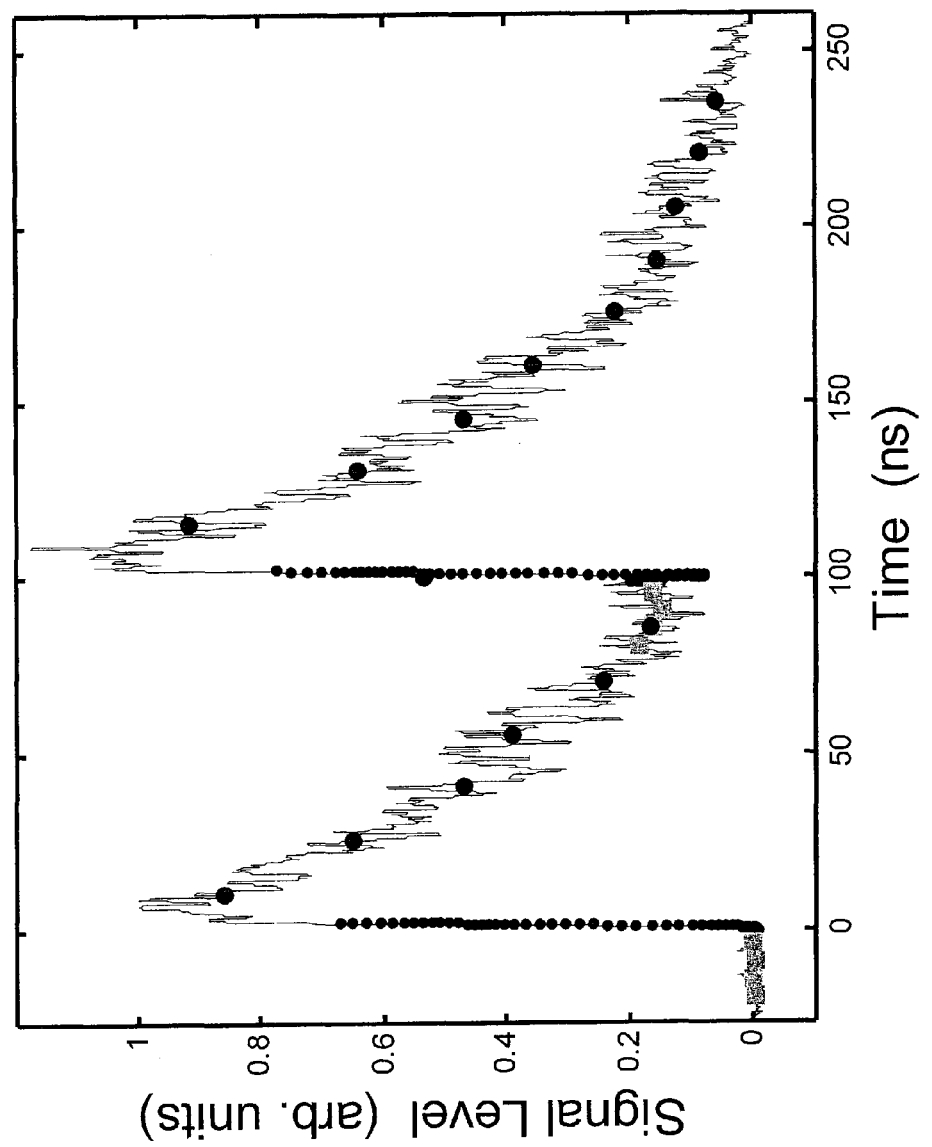
FIG. 11 illustrates a graph showing overlapping events in the signal obtained from a photosensor.

As is shown in FIG. 11, in the presence of multiple pulses, multiple time windows from different pulses might overlap. However, the system can have a first additional output that is the integral of the signal over a programmable integration time. This output can be used for energy and position determination. The system can also have a second additional output that indicates if a "second" trigger was generated during any part of the signal that is being output for the "first" trigger. This pile up indicator can be used by the downstream processor as an indication that a pile-up correction should be performed on both the "first" and "second" pulses.

Figure 12:
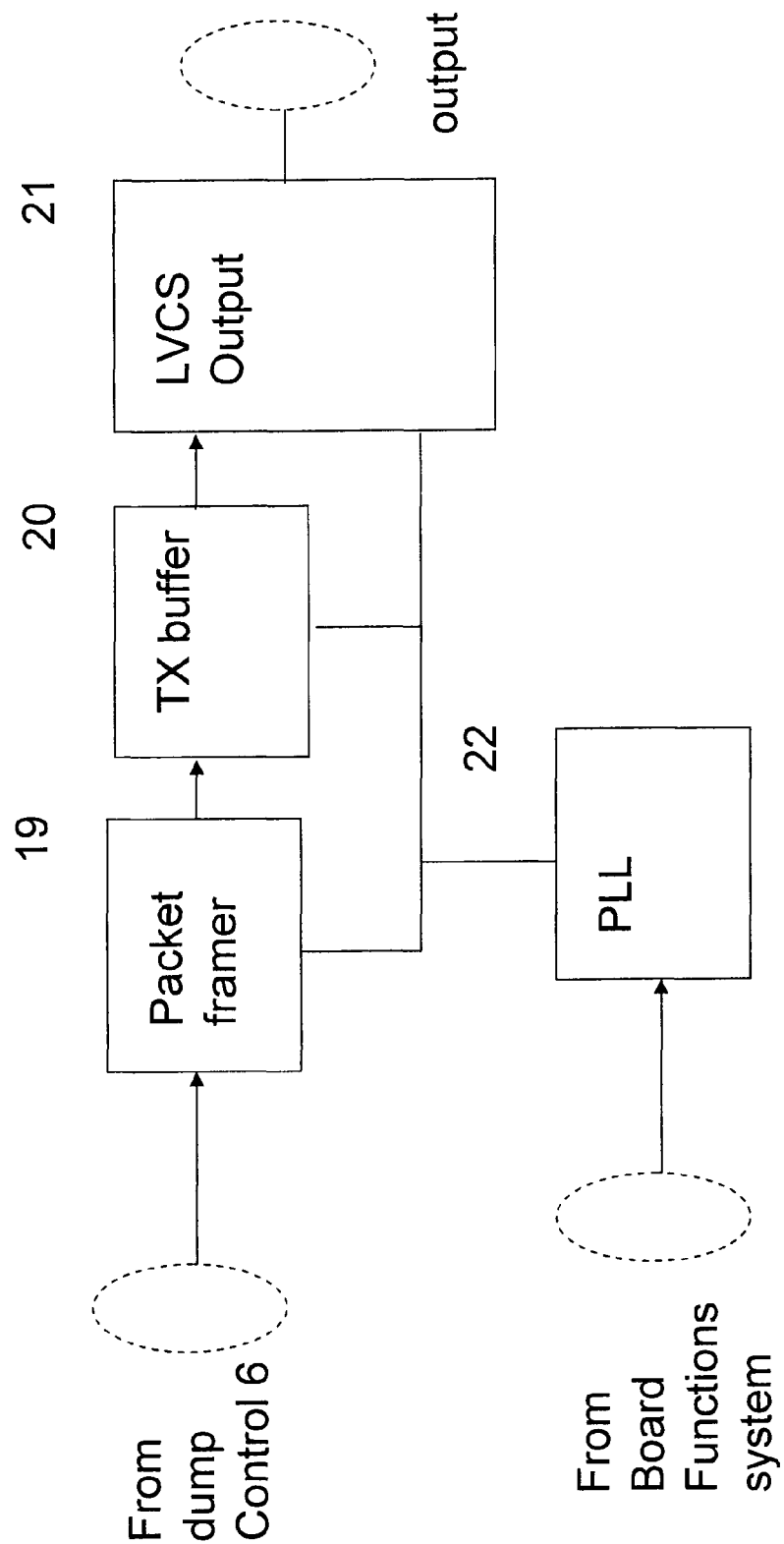
FIG. 12 illustrates an output section of a photosensor output signal processing system according to one embodiment.

Once the dump control section 6 determines what data should be passed to the output stage 7 and what data should be discarded, decimated, etc., the dump control unit 6 passes the saved digital data, potentially along with the first and second additional outputs, to the output stage 7. As shown in FIG. 12, the output stage 7 includes a packet framer unit 19, a TX buffer 20, a low voltage differential signaling (LVDS) output unit 21, and a phase locked loop unit 22. The output stage 7 prepares the data for output. Other implementations of the output stage 7 are possible.

Figure 13:
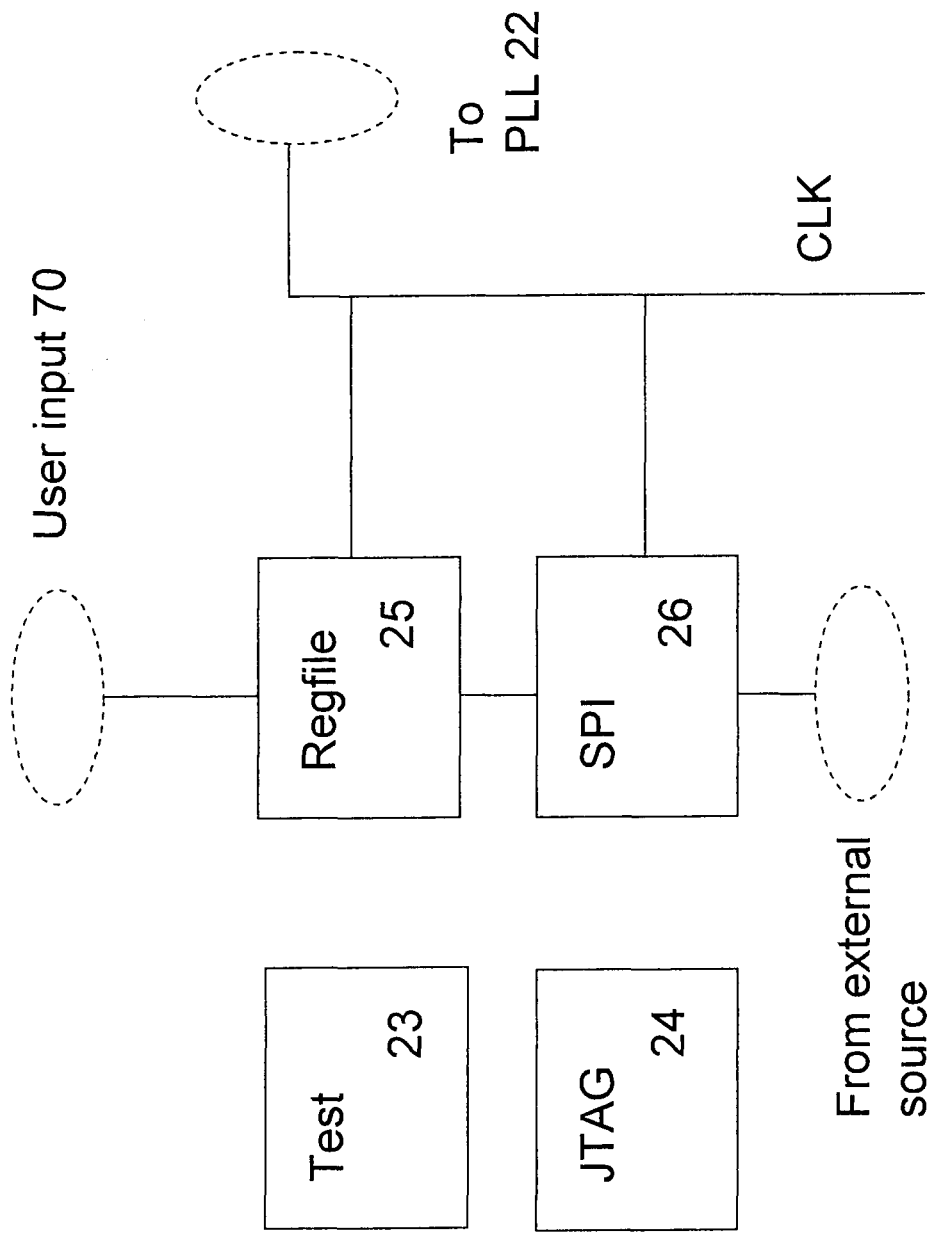
FIG. 13 illustrates a board functions section of a photosensor output signal processing system according to one embodiment.

The PLL unit 22 is connected to a clock included in the board functions section 8, as shown in FIG. 13. The board functions section 8 implements functions of the board that can be controlled. A separate communication link is included in the board functions section 8 and enables external access for uploading various parameters, such as digital filter configurations, trigger conditions, pre-amp settings, and communication settings. The board functions section 8 includes a test controller 23 and a JTAG controller 24. Also included is a regfile 25, which is a register that stores the values of the user-programmable settings received via user input 70. The board function section 8 also includes an SPI interface 26, and a reference clock. The SPI interface 26 acts as the communications link. Other types of communications links are also possible. The user input 70 corresponds to the various user selected parameters shown in FIG. 2A.

Figure 14:
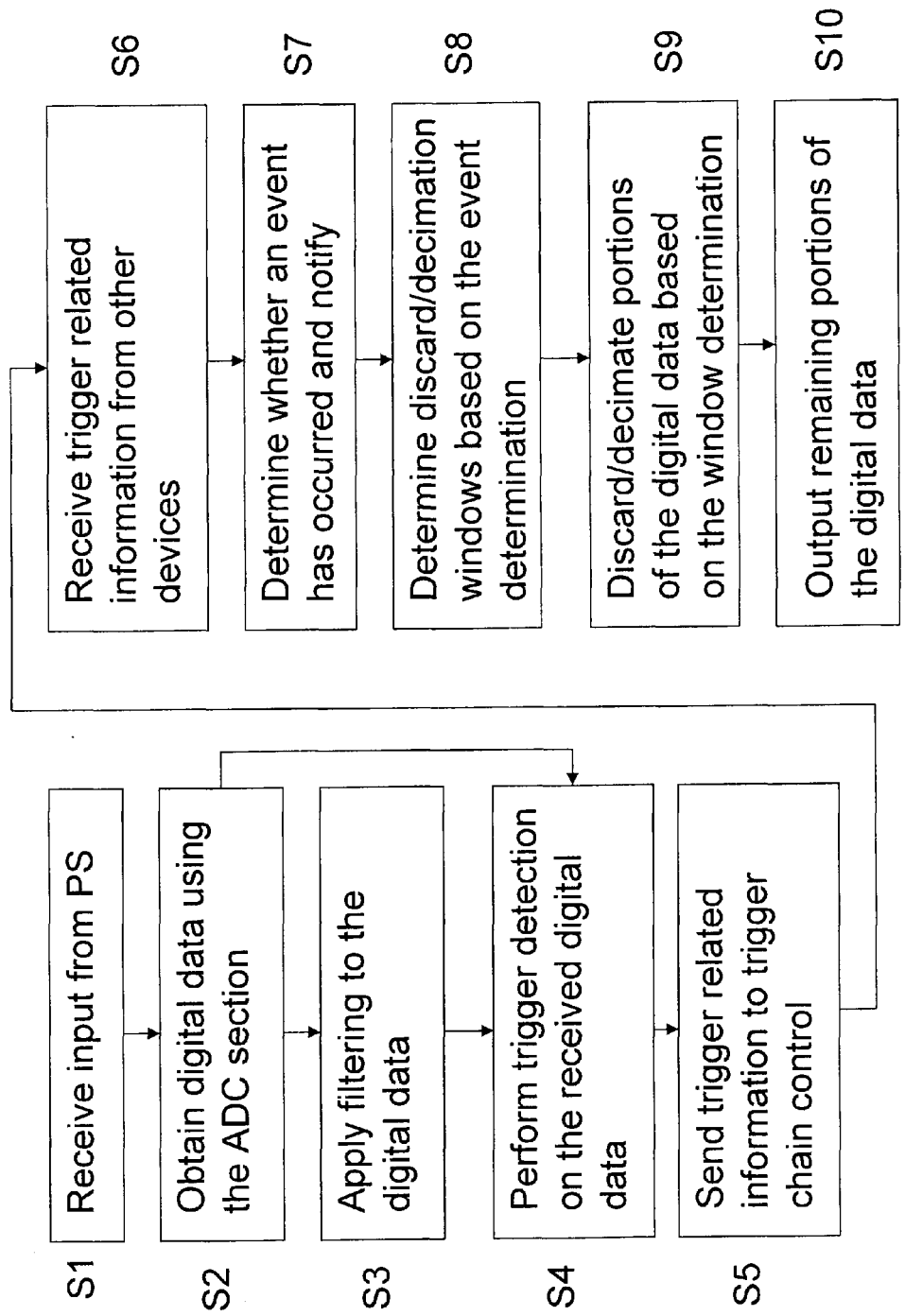
FIG. 14 illustrate steps in a method according to an embodiment described herein.
Figure 15:
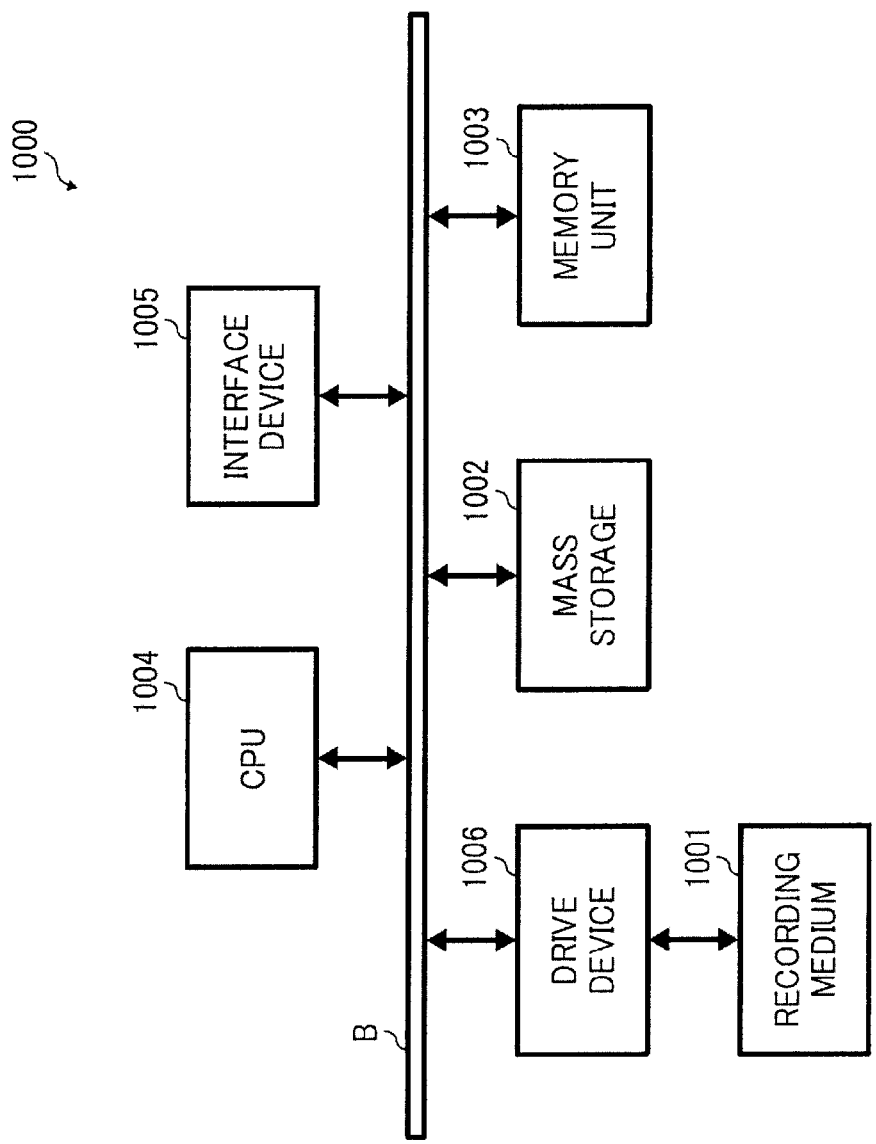
FIG. 15 illustrates a computer system according to one embodiment.

FIG. 14 illustrates the overall method of one embodiment described herein. In step S1, an analog signal output by the photosensor ("PS") connected to the photosensor output signal processing system 100 is received by the ADC section 2 of the photosensor output signal processing system 100. In step S2, the ADC section 2 obtains digital data from the analog signal. As noted above, the ADC section 2 can use one or more ADCs 11 to sample the analog photosensor signal.

The digital data obtained by the ADC section 2 is then output to the digital filter section 3 and/or output directly to the internal trigger detection section 5 and the dump control section 6. When the data is output to the digital filter section 3, step S3 of applying filtering to the digital data is performed. In step S4, the data to which the filtering is performed in step S3 or the digital data obtained directly from the ADC section 2 has internal trigger detection performed thereon. In the internal trigger detection, the digital data is analyzed to determine whether a trigger has been met. The trigger detection is an on-the-fly process as new digital data is continuously being output to the internal trigger detection section 5.

In step S5, when a trigger is detected by the trigger detection unit 5, the trigger information is sent to the trigger chain control unit 4. In step S6, additional PMT output signal processing devices 200/300 relay information to the trigger chain control unit 4. For instance, when information relating to the discovery of a trigger is discovered locally at the additional PMT output signal processing devices 200/300, this information is transmitted and received by the trigger chain control unit 4.

In step S7, the trigger chain control unit 4 determines whether an event has occurred based on the information received from the internal trigger detection unit 5, based on information received indicating that a trigger has been detected at one of the additional photosensor output signal processing devices 200/300, and/or based on information regarding the location or importance of a photosensor that has produced a signal that has resulted in a trigger detection. The information regarding a detected event can be sent as a notification to the additional photosensor output signal processing devices 200/300 in this step.

In step S8, once the trigger chain control unit 4 has determined that an event has occurred, this information is sent to the dump control section 6, which determines discard/decimation windows. The windows represent portions of the signal that have a particular amount of data discarded therefrom. In addition, the amount of decimation that is executed on a particular window and the size or position of the window compared to the leading edge of the event can be dynamically adjusted internally, based on tables or algorithms, or by external input via the board function section 8.

In step S9, once the dump control section 6 determines which portions of the signal to discard/decimate, the discarding/decimation is performed on the digital data. In step S10, the remaining data is then transferred to the output stage 7. It should be noted that steps S9 and S10 can be performed concurrently.

At least the digital filter 3, the internal trigger detection unit 5, the trigger chain control unit 4, and the dump control unit 6 can be implemented using some form of computer processor. As one of ordinary skill in the art would recognize, the computer processor can be implemented as discrete logic gates, as an Application Specific Integrated Circuit (ASIC), a Field Programmable Gate Array (FPGA) or other Complex Programmable Logic Device (CPLD). An FPGA or CPLD implementation may be coded in VHDL, Verilog or any other hardware description language and the code may be stored in an electronic memory directly within the FPGA or CPLD, or as a separate electronic memory. Further, the electronic memory may be non-volatile, such as ROM, EPROM, EEPROM or FLASH memory. The electronic memory may also be volatile, such as static or dynamic RAM, and a processor, such as a microcontroller or microprocessor, may be provided to manage the electronic memory as well as the interaction between the FPGA or CPLD and the electronic memory.

Alternatively, the computer processor may execute a computer program including a set of computer-readable instructions that perform the functions described herein, the program being stored in any of the above-described non-transitory electronic memories and/or a hard disk drive, CD, DVD, FLASH drive or any other known storage media. Further, the computer-readable instructions may be provided as a utility application, background daemon, or component of an operating system, or combination thereof, executing in conjunction with a processor, such as a Xenon processor from Intel of America or an Opteron processor from AMD of America and an operating system, such as Microsoft VISTA, UNIX, Solaris, LINUX, Apple, MAC-OSX and other operating systems known to those skilled in the art.

In addition, the data output from the output stage 7 can be processed to obtain energy of the event or timing, etc. using a computer based system 1000. The computer 1000 includes a bus B or other communication mechanism for communicating information, and a processor/CPU 1004 coupled with the bus B for processing the information. The computer 1000 also includes a main memory/memory unit 1003, such as a random access memory (RAM) or other dynamic storage device (e.g., dynamic RAM (DRAM), static RAM (SRAM), and synchronous DRAM (SDRAM)), coupled to the bus B for storing information and instructions to be executed by processor/CPU 1004. In addition, the memory unit 1003 may be used for storing temporary variables or other intermediate information during the execution of instructions by the CPU 1004. The computer 1000 may also further include a read only memory (ROM) or other static storage device (e.g., programmable ROM (PROM), erasable PROM (EPROM), and electrically erasable PROM (EEPROM)) coupled to the bus B for storing static information and instructions for the CPU 1004.

The computer 1000 may also include a disk controller coupled to the bus B to control one or more storage devices for storing information and instructions, such as mass storage 1002, and drive device 1006 (e.g., floppy disk drive, read-only compact disc drive, read/write compact disc drive, compact disc jukebox, tape drive, and removable magneto-optical drive). The storage devices may be added to the computer 1000 using an appropriate device interface (e.g., small computer system interface (SCSI), integrated device electronics (IDE), enhanced-IDE (E-IDE), direct memory access (DMA), or ultra-DMA).

The computer 1000 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer 1000 may also include a display controller coupled to the bus B to control a display, such as a cathode ray tube (CRT), for displaying information to a computer user. The computer system includes input devices, such as a keyboard and a pointing device, for interacting with a computer user and providing information to the processor. The pointing device, for example, may be a mouse, a trackball, or a pointing stick for communicating direction information and command selections to the processor and for controlling cursor movement on the display. In addition, a printer may provide printed listings of data stored and/or generated by the computer system.

The computer 1000 performs at least a portion of the processing steps of the invention in response to the CPU 1004 executing one or more sequences of one or more instructions contained in a memory, such as the memory unit 1003. Such instructions may be read into the memory unit from another computer readable medium, such as the mass storage 1002 or a removable media 1001. One or more processors in a multiprocessing arrangement may also be employed to execute the sequences of instructions contained in memory unit 1003. In alternative embodiments, hard-wired circuitry may be used in place of or in combination with software instructions. Thus, embodiments are not limited to any specific combination of hardware circuitry and software.

As stated above, the computer 1000 includes at least one computer readable medium 1001 or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other medium from which a computer can read.

Stored on any one or on a combination of computer readable media, the present invention includes software for controlling the main processing unit 1004, for driving a device or devices for implementing the invention, and for enabling the main processing unit 1004 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code elements on the medium of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the CPU 1004 for execution. A computer readable medium may take many forms, including but not limited to, non-volatile media, and volatile media. Non-volatile media includes, for example, optical, magnetic disks, and magneto-optical disks, such as the mass storage 1002 or the removable media 1001. Volatile media includes dynamic memory, such as the memory unit 1003.

Various forms of computer readable media may be involved in carrying out one or more sequences of one or more instructions to the CPU 1004 for execution. For example, the instructions may initially be carried on a magnetic disk of a remote computer. An input coupled to the bus B can receive the data and place the data on the bus B. The bus B carries the data to the memory unit 1003, from which the CPU 1004 retrieves and executes the instructions. The instructions received by the memory unit 1003 may optionally be stored on mass storage 1002 either before or after execution by the CPU 1004.

The computer 1000 also includes a communication interface 1005 coupled to the bus B. The communication interface 1004 provides a two-way data communication coupling to a network that is connected to, for example, a local area network (LAN), or to another communications network such as the Internet. For example, the communication interface 1005 may be a network interface card to attach to any packet switched LAN. As another example, the communication interface 1005 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1005 sends and receives electrical, electromagnetic or optical signals that carry digital data streams representing various types of information.

The network typically provides data communication through one or more networks to other data devices. For example, the network may provide a connection to another computer through a local network (e.g., a LAN) or through equipment operated by a service provider, which provides communication services through a communications network. The local network and the communications network use, for example, electrical, electromagnetic, or optical signals that carry digital data streams, and the associated physical layer (e.g., CAT 5 cable, coaxial cable, optical fiber, etc). Moreover, the network may provide a connection to a mobile device such as a personal digital assistant (PDA) laptop computer, or cellular telephone.

While certain embodiments have been described, these embodiments have been presented by way of example only, and are not intended to limit the scope of the inventions. Indeed the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A system for processing an analog signal output by a sensor, the system comprising:
   at least one analog-to-digital converter (ADC) configured to convert the analog output signal to a digital signal, the digital signal including a plurality of samples at a predetermined resolution;
   a trigger detection unit configured to detect whether a trigger condition is met by analyzing the digital signal;
   an event detection unit configured to detect an event based on trigger information from the trigger detection unit and to generate event information having time information included therein when the event is detected;
   a decimation unit configured to define one or more time windows based on the time information included in the event information and to perform decimation on the digital signal based on the defined one or more time windows to generate a decimated signal; and
   an output unit configured to output the decimated signal.

2. The system of claim 1, wherein
   the at least one ADC includes a pair of ADCs, with each ADC operating at a fraction of a frequency corresponding to the predetermined resolution; and
   each ADC operates in an interleave mode such that a first ADC samples the analog signal and a second ADC samples parts of the analog signal between samples obtained by the first ADC.

3. The system of claim 2, wherein
   a combined sampling rate of the pair of ADCs is 1 GHz or more.

4. The system of claim 2, wherein
   each ADC has a sampling rate of 500 MHz or more.

5. The system of claim 1, wherein
   the at least one ADC includes a pair of ADCs; and
   the system further includes a switch which switches the system between an interleaved mode in which each ADC operates at a fraction of a frequency corresponding to the predetermined resolution, and a non-interleaved mode in which the pair of ADCs process independent channels.

6. The system of claim 1, wherein
   the trigger detection unit is configured to detect that the trigger condition is met when a predetermined number of data points in the digital signal are detected as being above a predetermined threshold.

7. The system of claim 1, wherein the trigger detection unit is configured to detect whether the trigger condition is met based on a programmable trigger condition.

8. The system of claim 1, further comprising:
   a digital filtering unit configured to perform digital filtering on the digital signal prior to the trigger detection unit performing trigger detection on the digital signal.

9. The system of claim 8, wherein the digital filtering unit is programmable.

10. The system of claim 2, wherein
    the output of only a single ADC is passed to the trigger detection unit.

11. The system of claim 1, wherein
    the event detection unit is further configured to output the event information to a device external to the system in response to the detection of the event.

12. The system of claim 1, wherein
    the event detection unit is further configured to, in response to the detection of the event, output the event information to an external device, the external device having an ADC configured to convert an analog signal related to the analog signal.

13. The system of claim 1, wherein
    the trigger detection unit is configured to detect whether a trigger condition is met based on a derivative of the digital signal or a low-pass filtering of the digital signal.

14. The system of claim 1, wherein the decimation unit is configured to perform decimation on one or more segments of the digital signal using one or more different decimation factors.

15. The system of claim 1, wherein the output unit is further configured to output a value equal to an integral of the digital signal over a programmable time window.

16. The system of claim 1, wherein the output unit is further configured to output a pile-up indicator indicating that time windows of two events overlap.

17. A method for processing an analog signal output by a sensor, the method comprising:
    converting, using at least one analog-to-digital converter (ADC), the analog output signal to a digital signal, the digital signal including a plurality of samples at a predetermined resolution;
    detecting whether a trigger condition is met by analyzing the digital signal, and generating trigger information when the trigger condition is met;
    detecting an event based on the generated trigger information when the trigger condition is met;
    generating event information having time information included therein when the event is detected;
    defining one or more time windows based on the time information included in the event information;
    performing decimation on the digital signal based on the defined one or more time windows to generate a decimated signal; and
    outputting the decimated signal.

18. The method of claim 17, wherein the converting step further comprises:
    converting, using a pair of ADCs, the analog output signal to a digital signal, with each ADC operating at a fraction of a frequency corresponding to the predetermined resolution and each ADC operating in an interleave mode such that a first ADC samples the analog signal and a second ADC samples parts of the analog signal between samples obtained by the first ADC.

19. The method of claim 18, wherein
    a combined sampling rate of the pair of ADCs is 1 GHz or more.

20. The method of claim 18, wherein
    each ADC has a sampling rate of 500 MHz or more.

21. The method of claim 17, wherein
    the at least one ADC includes a pair of ADCs; and
    the method further includes the step of switching the system between an interleaved mode in which each ADC operates at a fraction of a frequency corresponding to the predetermined resolution, and a non-interleaved mode in which the pair of ADCs process independent channels.

22. The method of claim 17, wherein the detecting step further comprises:
    detecting that the trigger condition is met when a predetermined number of data points in the digital signal are detected as being above a predetermined threshold.

23. The method of claim 17, wherein the detecting step further comprises:
    detecting whether the trigger condition is met based on a programmable trigger condition.

24. The method of claim 17, further comprising:
performing digital filtering on the digital signal prior to the step of detecting whether the trigger condition is met by analyzing the digital signal.

25. The method of claim 24, wherein the step of performing digital filtering on the digital signal is performed using a programmable digital filtering unit.

26. The method of claim 18, wherein the step of detecting whether the trigger condition is met comprises detecting whether the trigger condition is met based on the output of a single ADC.

27. The method of claim 17, wherein the detecting step further comprises:
outputting the event information to a device external to the system in response to the detection of the event.

28. The method of claim 17, wherein the detecting step further comprises:
in response to the detection of the event, outputting the event information to an external device, the external device having an ADC configured to convert an analog signal related to the analog signal.

29. The method of claim 17, wherein the detecting step further comprises:
detecting whether a trigger condition is met based on a derivative of the digital signal or a low-pass filtering of the digital signal.

30. The method of claim 17, wherein the step of performing decimation further comprises:
performing decimation on one or more segments of the digital signal using one or more different decimation factors.

31. The method of claim 17, wherein the outputting step further comprises:
outputting a value equal to an integral of the digital signal over a programmable time window.

32. The method of claim 17, wherein the outputting step further comprises:
outputting a pile-up indicator indicating that time windows of two events overlap.

33. The system of claim 1, further comprising:
a comparator and a time-to-digital converter, the comparator and the time-to-digital converter configured to provide an extra sampling point obtained at a leading edge of the event in the analog output signal.

34. The system of claim 33, wherein the decimation unit is configured to receive the extra sampling point obtained at the leading edge of the event in the analog output signal and transmit information related to the extra sampling point to the output unit, the extra sampling point being output along with the decimated signal.

* * * * *